(12) United States Patent
Shiozaki et al.

(10) Patent No.: US 9,431,357 B2
(45) Date of Patent: Aug. 30, 2016

(54) WIRING BOARD AND HIGH FREQUENCY MODULE USING SAME

(75) Inventors: Ryosuke Shiozaki, Kanagawa (JP); Suguru Fujita, Tokyo (JP)

(73) Assignee: Panasonic Corporation, Osaka (JP)

( * ) Notice: Subject to any disclaimer, the term of this patent is extended or adjusted under 35 U.S.C. 154(b) by 158 days.

(21) Appl. No.: 14/123,702

(22) PCT Filed: Aug. 23, 2012

(86) PCT No.: PCT/JP2012/005296
§ 371 (c)(1),
(2), (4) Date: Dec. 3, 2013

(87) PCT Pub. No.: WO2013/027409
PCT Pub. Date: Feb. 28, 2013

(65) Prior Publication Data
US 2014/0091885 A1    Apr. 3, 2014

(30) Foreign Application Priority Data

Aug. 23, 2011 (JP) .................................. 2011-181946
Aug. 29, 2011 (JP) .................................. 2011-186338

(51) Int. Cl.
*H01L 23/66*    (2006.01)
*H01L 21/56*    (2006.01)
*H05K 3/34*     (2006.01)
(Continued)

(52) U.S. Cl.
CPC ............. *H01L 23/66* (2013.01); *H01L 21/563* (2013.01); *H01P 3/081* (2013.01); *H01P 3/16* (2013.01); *H05K 3/3452* (2013.01); *H01L 24/73* (2013.01); *H01L 25/16* (2013.01); *H01L 2223/6627* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/1423* (2013.01);
(Continued)

(58) Field of Classification Search
CPC ............. H01P 3/08; H01P 3/16; H01L 23/66
USPC ....................................................... 333/247
See application file for complete search history.

(56) References Cited

U.S. PATENT DOCUMENTS

| | | | |
|---|---|---|---|
| 4,894,115 A | * | 1/1990 | Eichelberger et al. ........ 134/1.1 |
| 2002/0180004 A1 | * | 12/2002 | Oggioni et al. ............. 257/621 |
| 2007/0158838 A1 | | 7/2007 | Fujii |

FOREIGN PATENT DOCUMENTS

| CN | 1996587 A | 7/2007 |
|---|---|---|
| EP | 0 506 122 A2 | 9/1992 |

(Continued)

OTHER PUBLICATIONS

International Search Report, mailed Sep. 18, 2012, for PCT/JP2012/005296, 2 pages.

*Primary Examiner* — Benny Lee
*Assistant Examiner* — Albens Dieujuste
(74) *Attorney, Agent, or Firm* — Seed IP Law Group PLLC

(57) ABSTRACT

A high frequency module wiring board includes a wiring section for high frequency transmission, and a solder resist layer formed upon the wiring section. The solder resist layer covers the wiring section so as to have an opening section at a part of the wiring section in a region extending within a predetermined distance from an input/output terminal of a chip component.

9 Claims, 38 Drawing Sheets

(51) Int. Cl.
*H01P 3/16* (2006.01)
*H01P 3/08* (2006.01)
*H05K 1/02* (2006.01)
*H01P 5/02* (2006.01)
*H01L 25/16* (2006.01)
*H01L 23/00* (2006.01)

(52) U.S. Cl.
CPC ........ *H01L2924/3011* (2013.01); *H01P 5/028* (2013.01); *H05K 1/024* (2013.01); *H05K 1/0243* (2013.01)

(56) References Cited

FOREIGN PATENT DOCUMENTS

| | | |
|---|---|---|
| JP | 62-11296 A | 1/1987 |
| JP | 5-95236 A | 4/1993 |
| JP | 2000-269384 A | 9/2000 |
| JP | 2003-174244 A | 6/2003 |
| JP | 2003-273611 A | 9/2003 |
| JP | 2009-267227 A | 11/2009 |

\* cited by examiner (a)

(b)

(a)

(b)

(a)

(b)

(a)

(b)

(a)

(b)

(a)

(b)

WIRING BOARD AND HIGH FREQUENCY MODULE USING SAME

TECHNICAL FIELD

The present disclosure relates to a wiring board and a high frequency (microwave or millimeter wave) module using the same. Particularly, it relates to a high frequency module in which a high frequency circuit chip such as a wireless IC is mounted on a wiring board.

BACKGROUND ART

There has been widely used a technique in which a dielectric substance called a solder resist is applied to a portion which is not soldered in a board mounted with an SMT (Surface Mount Technology) component so that solder is restricted from extending over the board.

On the other hand, when the solder resist serving as a dielectric substance is disposed near a wiring section in a board mounted with a high frequency circuit element (high frequency circuit chip) and a board for a high frequency antenna module, dielectric loss of the solder resist leads to high-frequency transmission loss. An example of a wiring board covered with a solder resist layer is shown in FIG. 41(a) and FIG. 41(b).

In a wiring board 1 for a high frequency antenna module, a wiring section 3 and a back wiring section 7 are formed in front and back surfaces of a dielectric layer 4, and a surface mount type component such as a chip component 2 is mounted.

A solder resist layer 5 serving as a dielectric substance is disposed near the front-surface wiring section 3 mounted with the surface mount type chip component 2 so that solder 6 cannot spread over the board. However, dielectric loss of the solder resist layer 5 leads to high-frequency transmission loss. In addition, increase in effective dielectric constant caused by the solder resist layer 5 leads to reduction in effective wavelength so as to increase the transmission loss.

A technique described in Patent Literature 1 has been known as a mounting method relating to the module board. According to the mounting method in Patent Literature 1, manufacturing of a module has been disclosed as follows. That is, a solder resist layer is applied to a board during manufacturing of the board, and an SMT component is mounted on the board by soldering. After that, the solder resist layer is entirely removed by a solvent. Thus, loss in high frequency characteristics can be suppressed in the module.

CITATION LIST

Patent Literature

Patent Literature 1: JP-A-62-11296

SUMMARY OF THE INVENTION

Problems to be Solved by the Invention

However, the background-art technique described in Patent Literature 1 has the following problem. The solder resist layer has an effect of increasing adhesive strength of a conductor pattern serving as a wiring on the board as well as an effect of suppressing the spreading of solder. Since a conductor wiring or a passive element wiring for an antenna keeps adhesive strength to the board due to the solder resist layer, the wiring is easily separated by the technique in Patent Literature 1 in which the resist is entirely removed. Thus, the reliability of the module is lowered.

The present disclosure has been accomplished in consideration of the actual situation. An object of the disclosure is to provide a highly reliable high frequency module wiring board in which the influence of dielectric loss and reduction in effective wavelength are suppressed without entirely removing a solder resist layer, so as to suppress increase in transmission loss and enhance the strength of each wiring, and a high frequency module using the wiring board.

Means for Solving the Problems

Therefore, according to the disclosure, a high frequency module wiring board includes a wiring section for high frequency transmission, and a solder resist layer which is formed on the wiring section, wherein: the solder resist layer has an opening section at a part on the wiring section in a region extending within a predetermined distance from an input/output terminal of a chip component.

In addition, according to the disclosure, in the high frequency module wiring board, the opening section may include a plurality of openings formed at predetermined intervals.

In addition, according to the disclosure, in the high frequency module wiring board, the opening section of the solder resist layer may be composed of a stripe-like pattern having predetermined intervals.

In addition, according to the disclosure, in the high frequency module wiring board, the opening section may be quadrangular.

In addition, according to the disclosure, in the high frequency module wiring board, the opening section may be circular or elliptical.

In addition, according to the disclosure, in the high frequency module wiring board, the opening section may include side surfaces of the wiring section.

In addition, according to the disclosure, in the high frequency module wiring board, the opening section may be formed along the wiring section and arrayed on the wiring section excluding edge portions extending in a current path (current direction) of the wiring section.

In addition, according to the disclosure, in the high frequency module wiring board, the intervals in the opening section may be not longer than $\lambda g/8$ of a transmission frequency (wavelength $\lambda g$) on the wiring section.

In addition, according to the disclosure, in the high frequency module wiring board, the intervals in the opening section may decrease gradually as they go away from an input/output terminal of a surface mount type chip component mounted on the wiring section.

In addition, according to the disclosure, in the high frequency module wiring board, the width of the opening section may increase gradually as it goes away from an input/output terminal of a surface mount type chip component mounted on the wiring section.

In addition, according to the disclosure, the high frequency module wiring board may be used, and a surface mount type chip component mounted through an input/output terminal may be provided in a part of the wiring section.

In addition, according to the disclosure, the high frequency module wiring board may be used, and the wiring section may be used for microwave or millimeter-wave transmission.

Advantageous Effects of the Invention

According to the disclosure, it is possible to provide a high frequency module wiring board in which the strength of each wiring is high while high frequency characteristics are kept without entirely removing a solder resist layer.

BRIEF DESCRIPTION OF THE DRAWINGS

FIG. 28(a) being a top view, FIG. 28(b) being a sectional view taken on the line A-A in FIG. 28(a).

FIG. 34(a) and FIG. 34(b) being a main portion top view and a main portion sectional view showing the high frequency module according to the embodiment, FIG. 34(c) and FIG. 34(d) being a top view and a sectional view of a high frequency circuit chip according to the embodiment.

DESCRIPTION OF EMBODIMENTS

Wiring boards (high frequency module boards) for high frequency modules in embodiments of the disclosure will be described in detail with reference to the drawings.

Embodiment 1

Figure 1:
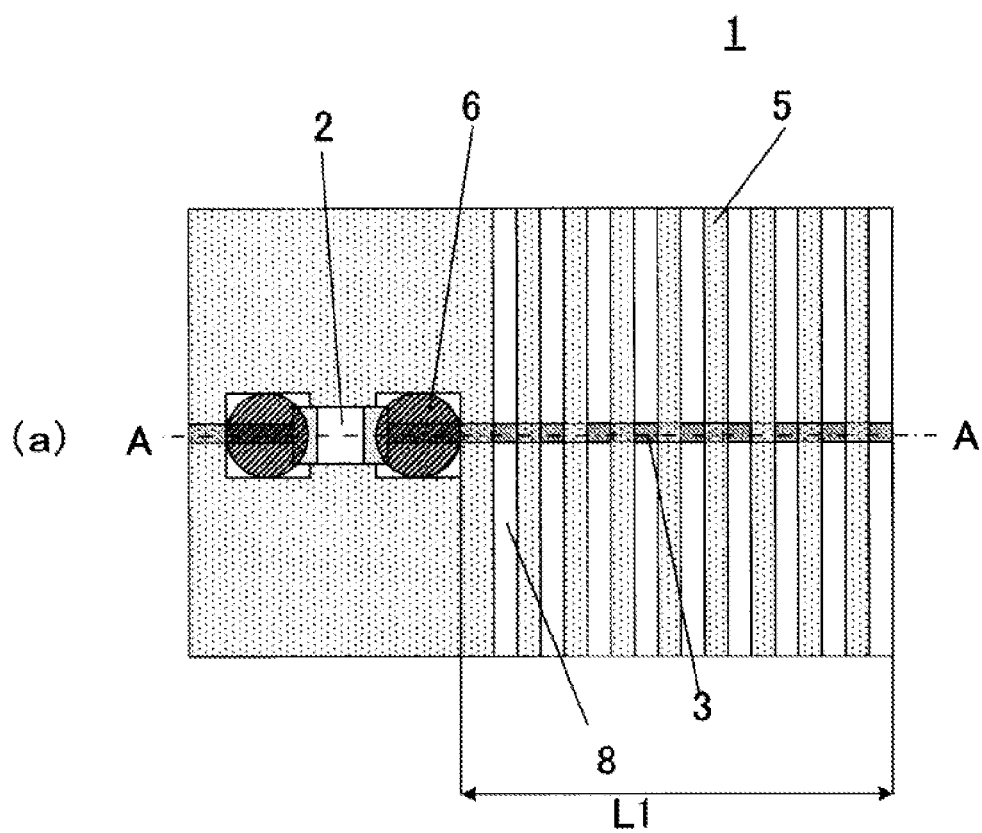
FIG. 1(a) is an explanatory view (top view) showing a main portion configuration of a high frequency module using a high frequency module wiring board according to Embodiment 1 of the disclosure.
FIG. 1(b) is an explanatory view (sectional view) cut in a wiring direction.
Figure 1:
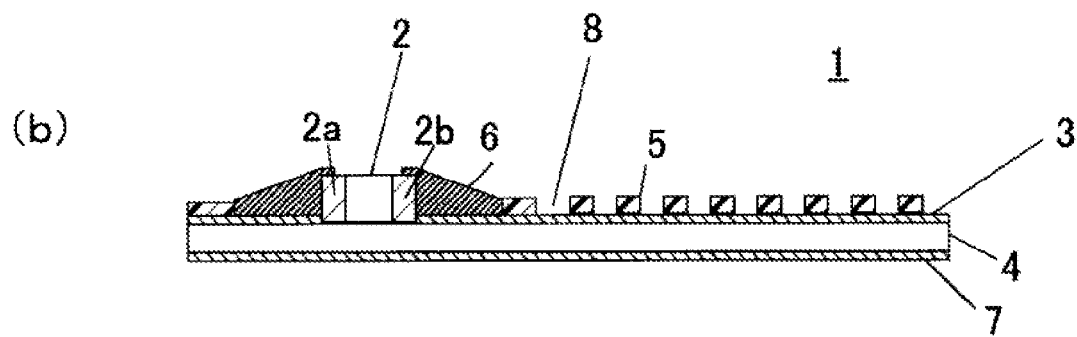
Figure 2:
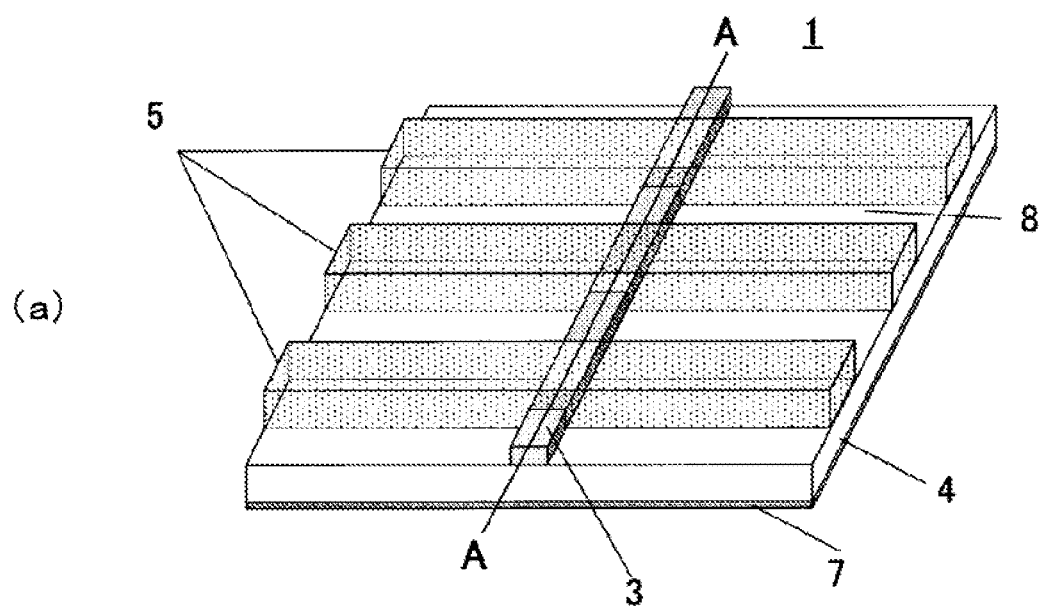
FIG. 2(a) is a main portion perspective view of a wiring section in the high frequency module wiring board according to Embodiment 1 of the disclosure.
FIG. 2(b) is a sectional view taken on the line A-A in FIG. 2(a).
Figure 2:
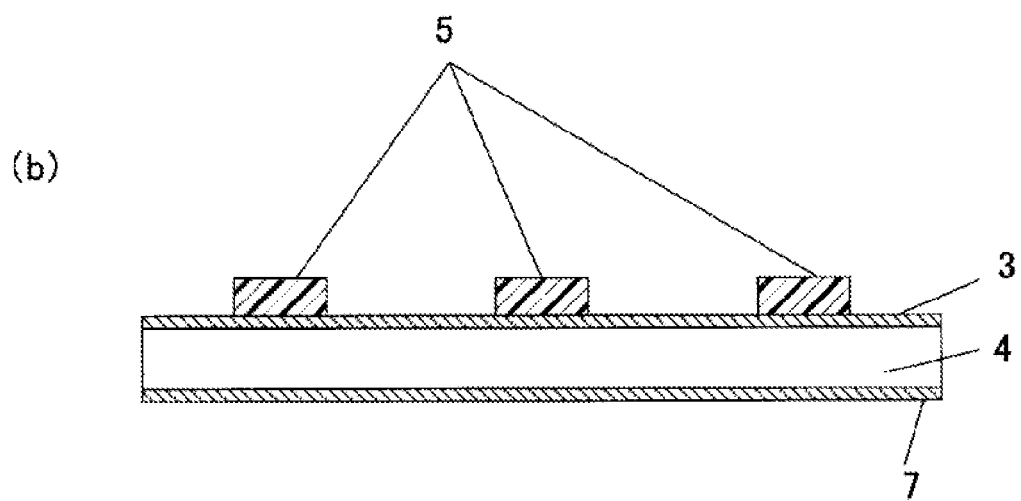
Figure 3:
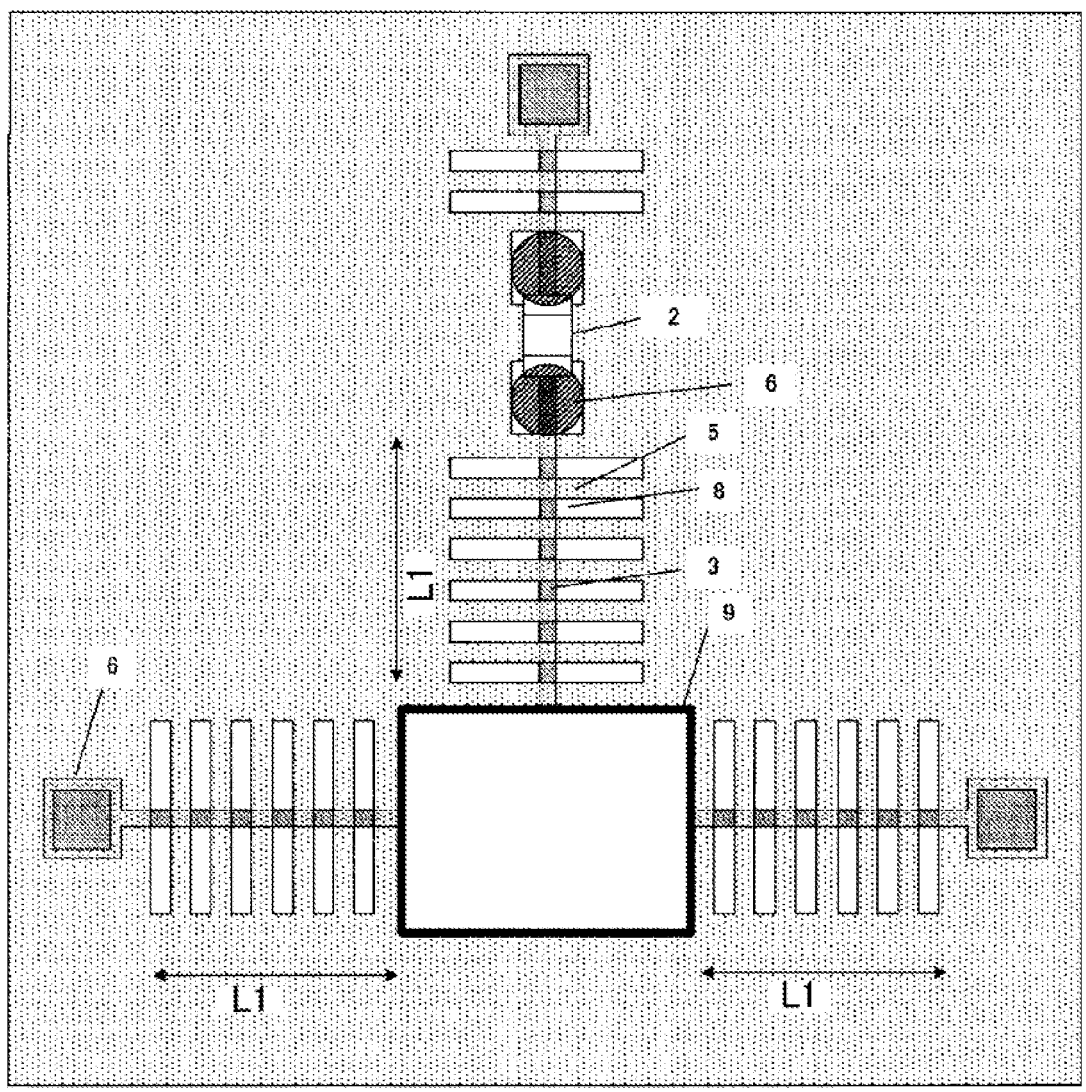
FIG. 3 is an overall schematic view of the high frequency module according to Embodiment 1 of the disclosure.

FIG. 1(a) is an explanatory view (top view) showing a main portion configuration of a high frequency module using a high frequency module wiring board according to Embodiment 1 of the disclosure, and FIG. 1(b) is an explanatory view (sectional view) cut in a wiring direction. FIG. 2(a) is a main portion perspective view of a wiring section, and FIG. 2(b) is a sectional view taken on the line A-A in FIG. 2(a). FIG. 3 is an overall schematic view of the high frequency module.

Figure 4:
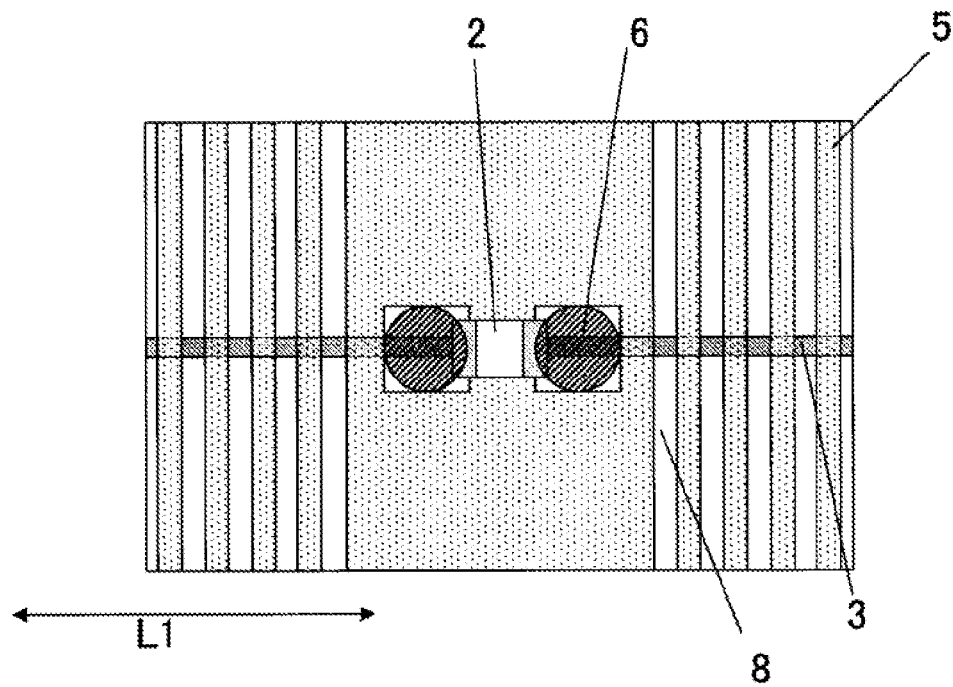
FIG. 4 is a top view showing the pattern of a solder resist layer near a surface mount type chip component (SMT component) 2 in the high frequency module according to Embodiment 1 of the disclosure.
Figure 5:
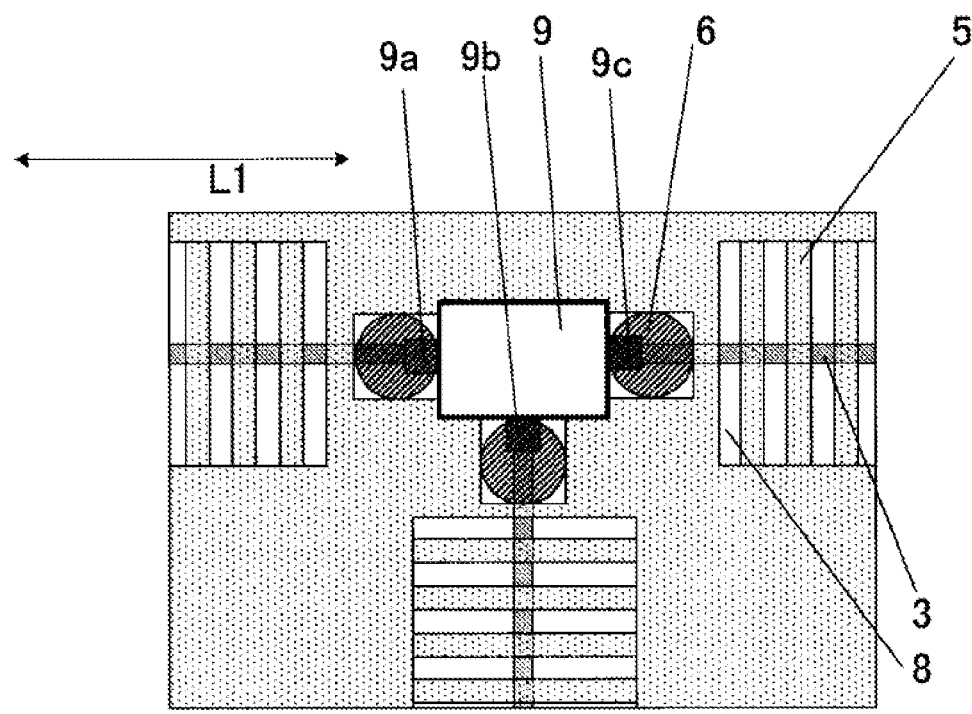
FIG. 5 is a top view showing the pattern of the solder resist layer near a three-terminal structure high frequency IC chip 9 in the high frequency module according to Embodiment 1 of the disclosure.

FIG. 4 is a top view showing a pattern of a solder resist layer near a surface mount type chip component (SMT component) 2. FIG. 5 is a top view showing the pattern of the solder resist layer near a high frequency IC chip 9 which is an SMT component with a three-terminal structure.

A wiring board 1 for a high frequency module according to the embodiment includes wiring sections 3 for high frequency transmission, and a solder resist layer 5 formed on the wiring sections 3. Openings 8 of the solder resist layer 5 are constituted by a plurality of stripe-like patterns. The solder resist layer 5 covers each of the wiring sections 3 at predetermined intervals.

The solder resist layer 5 is provided with the openings 8 at portions on the wiring section 3 in a region within a predetermined distance L1 from an input/output terminal 2a, 2b of the surface mount type chip component (SMT component) 2 as shown in the overall view of FIG. 3 and the main portion enlarged view of FIG. 4.

In addition, the solder resist layer 5 covers each of the wiring sections 3 so that the openings 8 are provided at portions on the wiring section 3 in a region within the predetermined distance L1 from each of input/output terminals 9a, 9b and 9c of the high frequency IC chip 9.

In addition, the whole of the back surface of the wiring board 1 is covered with a back-surface wiring section 7 using a metal, so as to form a microstrip line for the front-surface wiring section 3.

In addition, with reference to the overall view of FIG. 3, the mutual positional relation and the configuration of the wiring section are clear.

In the wiring board, a front-surface wiring section 3 and a back-surface wiring section 7 both using copper Cu are formed on a dielectric layer 4 made of a high-melting glass epoxy multilayer material, and a solder resist layer 5, for example, using a photosensitive liquid solder resist made by Hitachi Chemical Co., Ltd. and named PSR4000-AuS703 is formed as a top layer in the front surface as described above.

The solder resist layer 5 has, for example, a dielectric constant of 3.8 and a dissipation factor tang of 0.026 in 1 GHz. In addition, for example, a substrate is 40 μm thick, the solder resist layer 5 in the wiring section is 15 μm thick, and the front-surface wiring section 3 and the back-surface wiring section 7 are 16 μm thick. In addition, for example, a wiring in the front-surface wiring section 3 is 65 μm wide, and the characteristic impedance of the line is set at 50 Ω.

The portion to which the solder resist layer 5 is applied is 100 μm wide in the wiring direction, and the portion to which the solder resist is not applied is 100 μm wide in the wiring direction. The values are set as representative values. In addition, the openings 8 of the solder resist layer 5 are constituted by stripe-like patterns perpendicular to the direction of the wiring section 3. The solder resist layer 5 covers the front-surface wiring section 3 at predetermined intervals (with a width of 100 μm at intervals of 100 μm).

In addition, each opening 8 is quadrangular.

In mounting SMT components, the front-surface wiring sections 3 on the wiring board 1 are connected to terminals of an SMT component 2 which forms a two-terminal element such as a resistor, and terminals of a high frequency IC chip 9 including a three-terminal element, through solders 6 respectively.

The solder resist layer 5 is not applied to any portion to which the solder 6 is attached for mounting. Thus, the SMT component can be mounted while the spreading of the solders 6 is suppressed, so as to avoid connection to other components or wirings in the wiring sections 3 through the solders 6.

Further, in the embodiment, in order to suppress the influence of dielectric loss or the reduction of an effective wavelength to thereby suppress the increase of transmission loss, the solder resist layer 5 is removed partially like stripes perpendicular to the extension direction of each wiring section so as to selectively provide openings on the wiring section 3, while the wiring section 3 is partially covered with the solder resist layer 5.

Thus, the solder resist layer 5 also plays a role of keeping the connection strength between the wiring section 3 and the dielectric layer 4 on the wiring board 1.

The wiring board in the disclosure is arranged so that portions to which the solder resist layer 5 is not applied are provided in other portions than the portion where an SMT component is mounted, as shown in FIG. 1(a) and FIG. 1(b).

According to the wiring board 1 in the embodiment, portions to which a solder resist is applied and portions to which the solder resist is not applied are placed alternately along the wirings on the wiring board in which the wiring sections 3 are formed. Thus, transmission loss caused by the dielectric loss of the solder resist can be reduced. In addition, the increase in effective dielectric constant is suppressed, and the reduction in effective wavelength is suppressed. Thus, the increase in transmission loss can be reduced.

Figure 6:
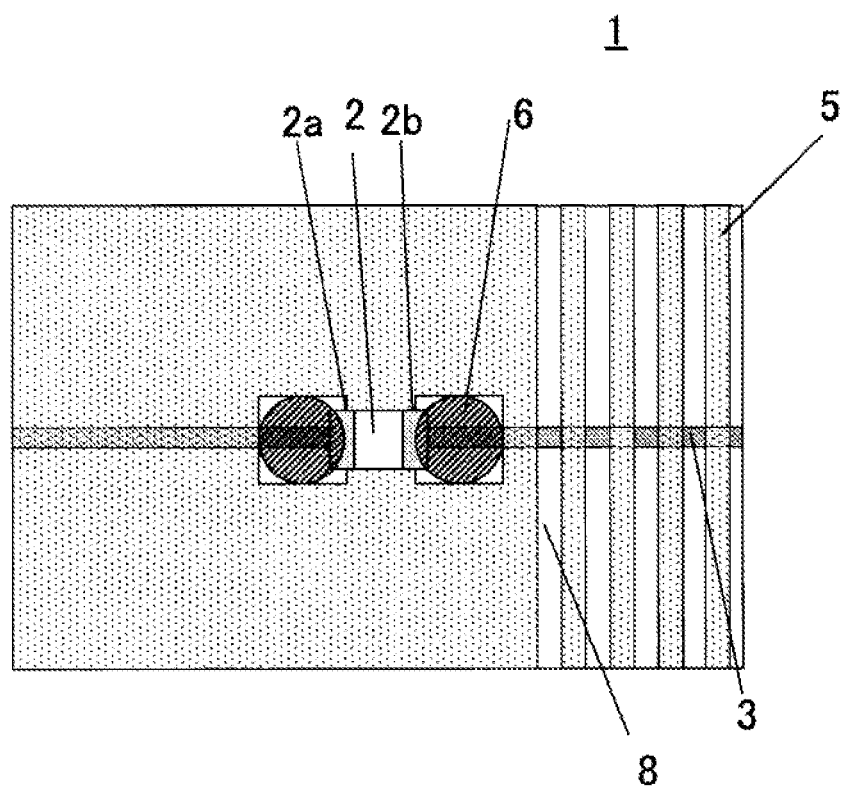
FIG. 6 is a view showing a modification of the high frequency module using the high frequency module wiring board according to Embodiment 1 of the disclosure.

Although portions to which the solder resist layer 5 is not applied are placed on the opposite sides of the two wirings connected to the two-terminal SMT component and on the sides of the three wirings connected to the three-terminal SMT component according to the embodiment, portions to which the solder resist layer 5 is not applied may be placed in at least one of the wirings of the wiring sections 3 as shown in a modification of FIG. 6.

According to the wiring board in the embodiment, the solder resist layer 5 is removed not entirely but partially on the wirings of the wiring sections, so that the influence of dielectric loss and the reduction in effective wavelength can be suppressed so as to suppress the increase in transmission loss and enhance the strength of each wiring. Thus, it is possible to provide a highly reliable high frequency module wiring board.

Figure 7:
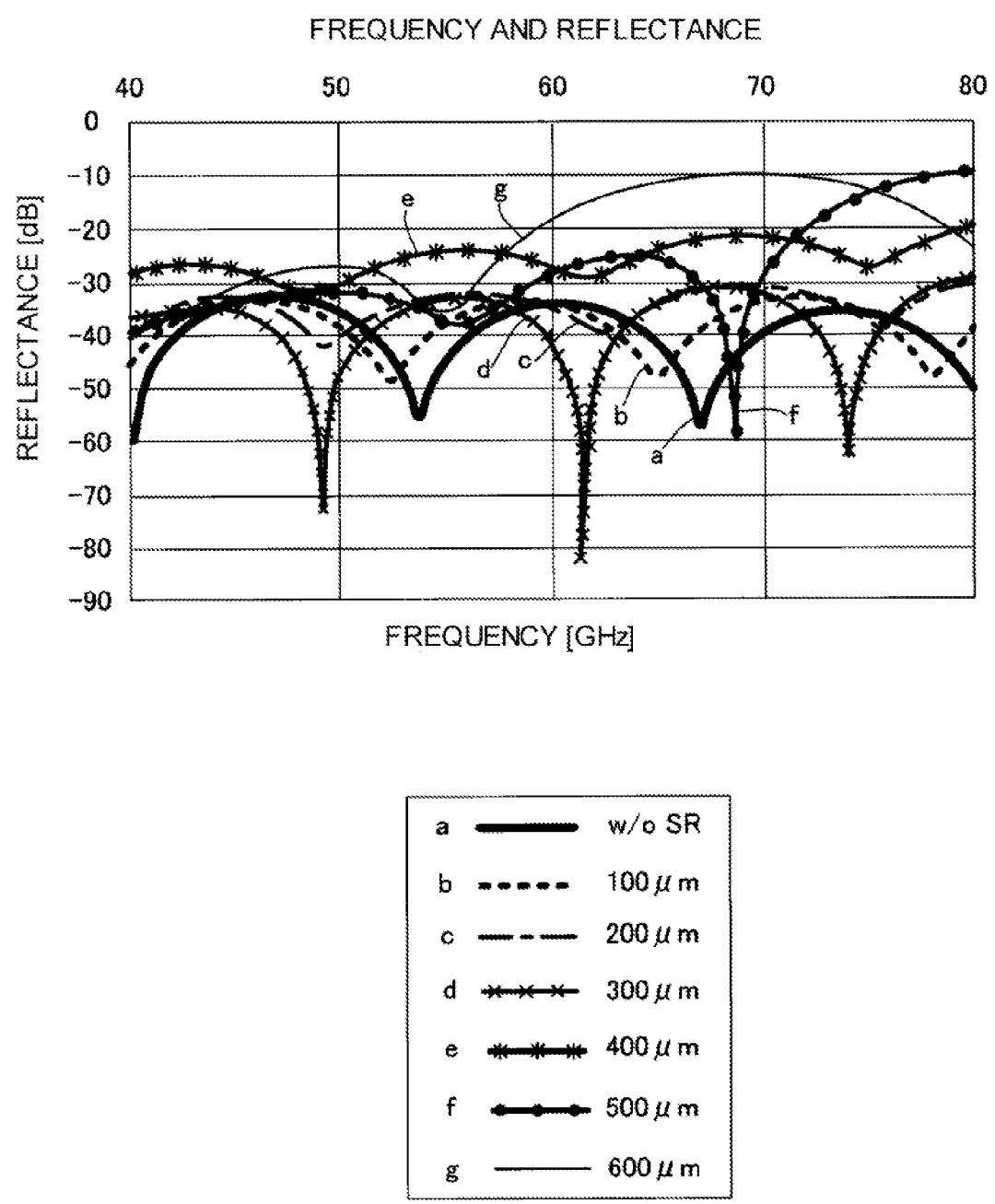
FIG. 7 is a graph showing results of reflectance measured when the intervals of openings of the solder resist layer in the high frequency module wiring board according to Embodiment 1 of the disclosure were varied.

In addition, FIG. 7 shows results of reflectance measured when the intervals of the openings 8 were varied. The ordinate designates reflectance and the abscissa designates frequency (GHz).

A line a designates a measured value when the whole was covered with the solder resist layer (w/o SR). A line b designates a measured value when the intervals of the openings in the solder resist layer were set as 100 µm. A line c designates a measured value when the intervals of the openings in the solder resist layer were set as 200 µm. A line d designates a measured value when the intervals of the openings in the solder resist layer were set as 300 µm. A line e designates a measured value when the intervals of the openings in the solder resist layer were set as 400 µm. A line f designates a measured value when the intervals of the openings in the solder resist layer were set as 500 µm. A line g designates a measured value when the intervals of the openings in the solder resist layer were set as 600 µm.

From FIG. 7, it is known that the reflectance when the intervals of the openings in the solder resist layer are not smaller than 400 µm is lower than when the intervals are not larger than 300 µm. The reflectance is −30 [dB] or less when the intervals of the openings in the solder resist layer are larger than 400 µm.

Figure 8:
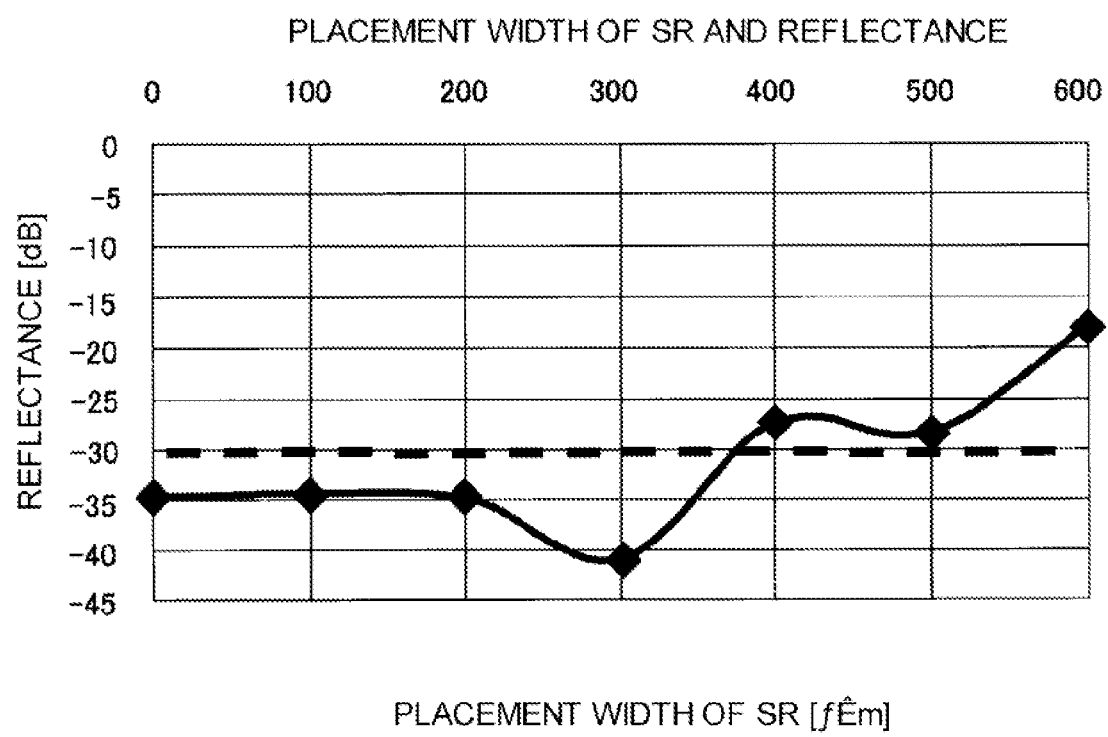
FIG. 8 is a graph showing results of reflectance measured when the intervals of the openings of the solder resist layer in the high frequency module wiring board according to Embodiment 1 of the disclosure were varied.

In addition, FIG. 8 shows results of reflectance measured at 60 GHz. In FIG. 8, the ordinate designates reflectance and the abscissa designates the width of the placed solder resist (SR), that is, the intervals of the openings. The reflectance when the width of the placed solder resist, that is, the intervals of the openings are not smaller than 400 µm is lower than when the intervals are not larger than 300 µm. Incidentally, at 60 GHz, 300 µm corresponds to $\lambda g/8$ ($\lambda g$: the wavelength of a transmission frequency).

That is, it is desirable that the intervals of the openings are set to be not higher than $\lambda g/8$ of the transmission frequency on each wiring section in the high frequency module wiring board.

Further, it is desirable that the pitch of the openings, that is, the sum of the width of each opening and the pattern width of the solder resist layer is set at a value smaller than half the wavelength at the transmission frequency. This is because the reflection of a signal on the input side increases when there is a change in impedance repeated by the intervals of half the wavelength.

Each point where the impedance changes serves as a reflection surface of a high frequency signal, a part of which is reflected toward an original path while the remaining part of the signal is transmitted. Of the signal inputted from the input side, a signal reflected on an $n+1^{th}$ reflection surface passes through a half-wavelength path and returns to an $n^{th}$ reflection surface. The reflected signal which has a phase changed correspondingly to a half of the wavelength is not reflected again on the $n^{th}$ reflection surface but returns to the input side. Thus, the reflectance deteriorates.

For that reason, it can be said that it is desirable that the sum of the width of each opening and the pattern width of the solder resist layer is set at a value smaller than half the wavelength $\lambda g$ at the transmission frequency.

Embodiment 2

Figure 9:
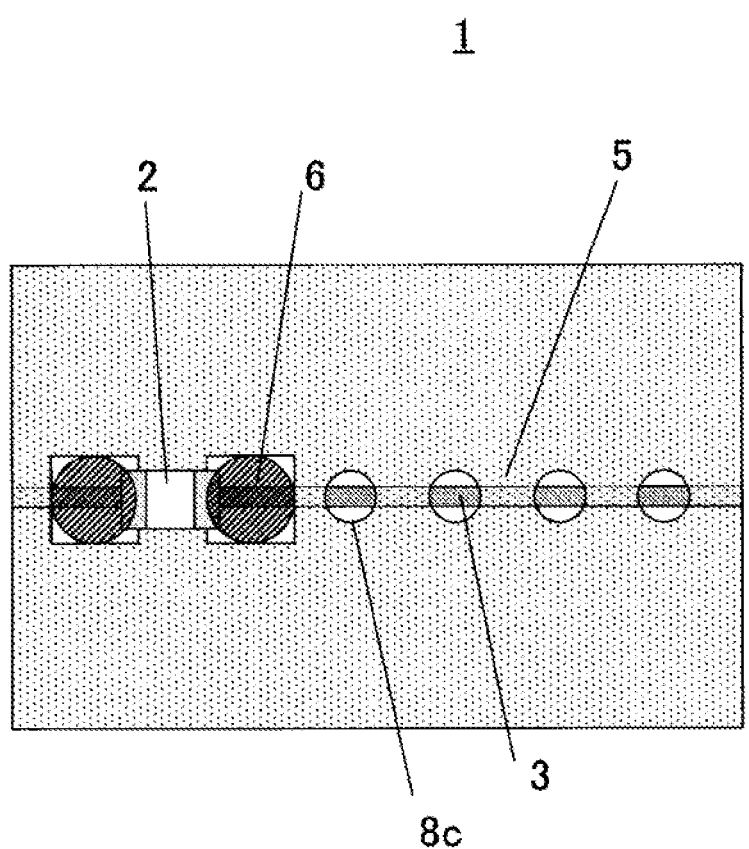
FIG. 9 is a view showing a main portion configuration of a high frequency module using a high frequency module wiring board according to Embodiment 2 of the disclosure.

FIG. 9 is a view showing a main portion configuration of a high frequency module using a high frequency module wiring board according to Embodiment 2 of the disclosure. FIG. 9 is a top view showing a pattern of a solder resist layer 5 near a surface mount type chip component (SMT component) 2.

The solder resist layer in Embodiment 2 has circular openings 8c provided at predetermined intervals in the pattern of the solder resist layer 5 on the wiring section 3. The other portions, for example, the configuration of the wiring section are similar to those in the embodiment, and description thereof will be omitted here.

Incidentally, in the same manner as in Embodiment 1, it is desirable that the intervals of the openings 8c are set at about $\lambda g/8$ or less.

Figure 10:
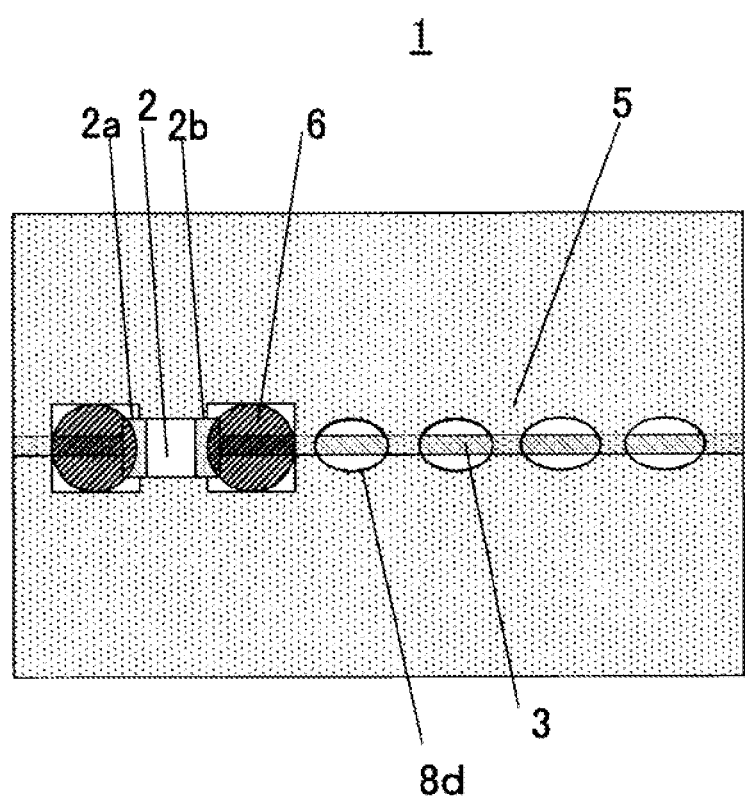
FIG. 10 is a top view showing a main portion configuration of a high frequency module using a high frequency module wiring board according to Embodiment 3 of the disclosure.

In addition, the portions to which a solder resist is not applied, that is, the openings are not limited to stripe-like openings, quadrangular openings or circular openings, but they may be formed as polygonal openings, for example, oval openings 8d as shown in FIG. 10.

According to the wiring board in the embodiment, in the same manner as in the Embodiment 1, the solder resist layer 5 is removed not entirely but partially on each wiring of the wiring section, so that the influence of dielectric loss and the reduction in effective wavelength can be suppressed so as to suppress the increase in transmission loss and enhance the strength of the wiring. Thus, it is possible to provide a highly reliable high frequency module wiring board.

Embodiment 3

Figure 11:
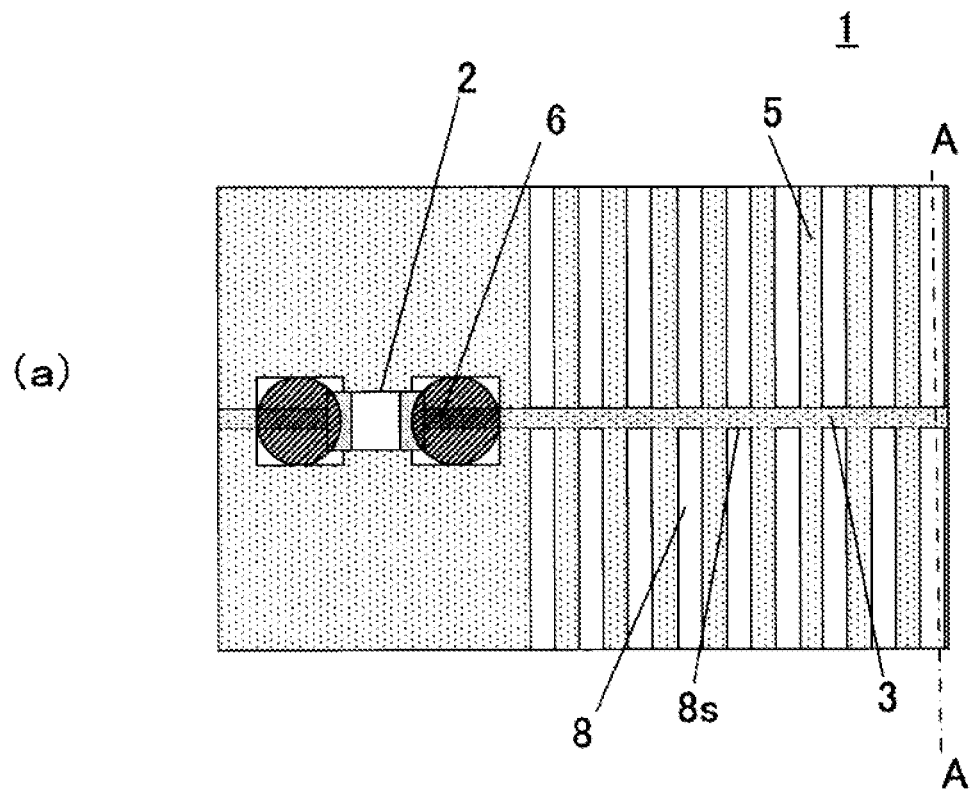
FIG. 11(a) is a top view showing a main portion configuration of a high frequency module using a high frequency module wiring board according to Embodiment 3 of the disclosure.
FIG. 11(b) is a sectional view (sectional view taken on the line A-A) cut in a wiring direction.
Figure 11:
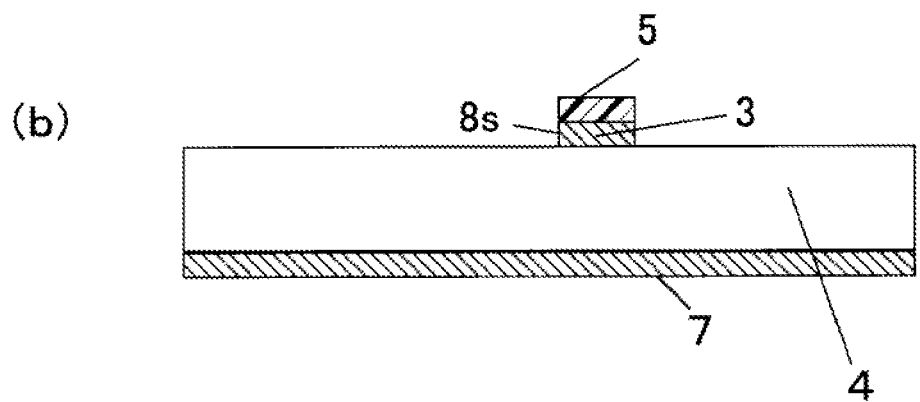

FIG. 11(a) and FIG. 11(b) are views showing a main portion configuration of a high frequency module using a high frequency module wiring board according to Embodiment 3 of the disclosure. FIG. 11(a) is a top view showing the main portion configuration of the high frequency module using the high frequency module wiring board according to Embodiment 3 of the disclosure, and FIG. 11(b) is a sectional view (sectional view taken on the line A-A) cut in a wiring direction.

In the same manner as in Embodiment 1, openings 8 shaped like stripes are formed in a solder resist layer in the high frequency module wiring board in Embodiment 3. However, the solder resist layer 5 on each wiring section 3 is left as it is, while the solder resist layer 5 on opposite sides of the wiring section 3 is removed. Thus, side openings 8s are formed on the opposite sides of the wiring section 3.

Incidentally, the other portions including the configuration of the wiring section 3 are similar to those in the embodiment, and description thereof will be omitted here.

Incidentally, in the same manner as in Embodiment 1, it is desirable that the intervals of the openings 8 are set at about $\lambda g/8$ or less.

The portions to which a solder resist is not applied, that is, the openings 8 are not limited to stripe-like openings, quadrangular openings or circular openings, but they may be formed as polygonal openings, for example, oval openings 8d as shown in FIG. 10.

According to the wiring board in the embodiment, in the same manner as in Embodiment 1, the solder resist layer 5 is removed not entirely but partially on the wiring of each wiring section, so that the influence of dielectric loss and the reduction in effective wavelength can be suppressed so as to suppress the increase in transmission loss and enhance the strength of the wiring. Thus, it is possible to provide a highly reliable high frequency module wiring board.

Embodiment 4

Figure 12:
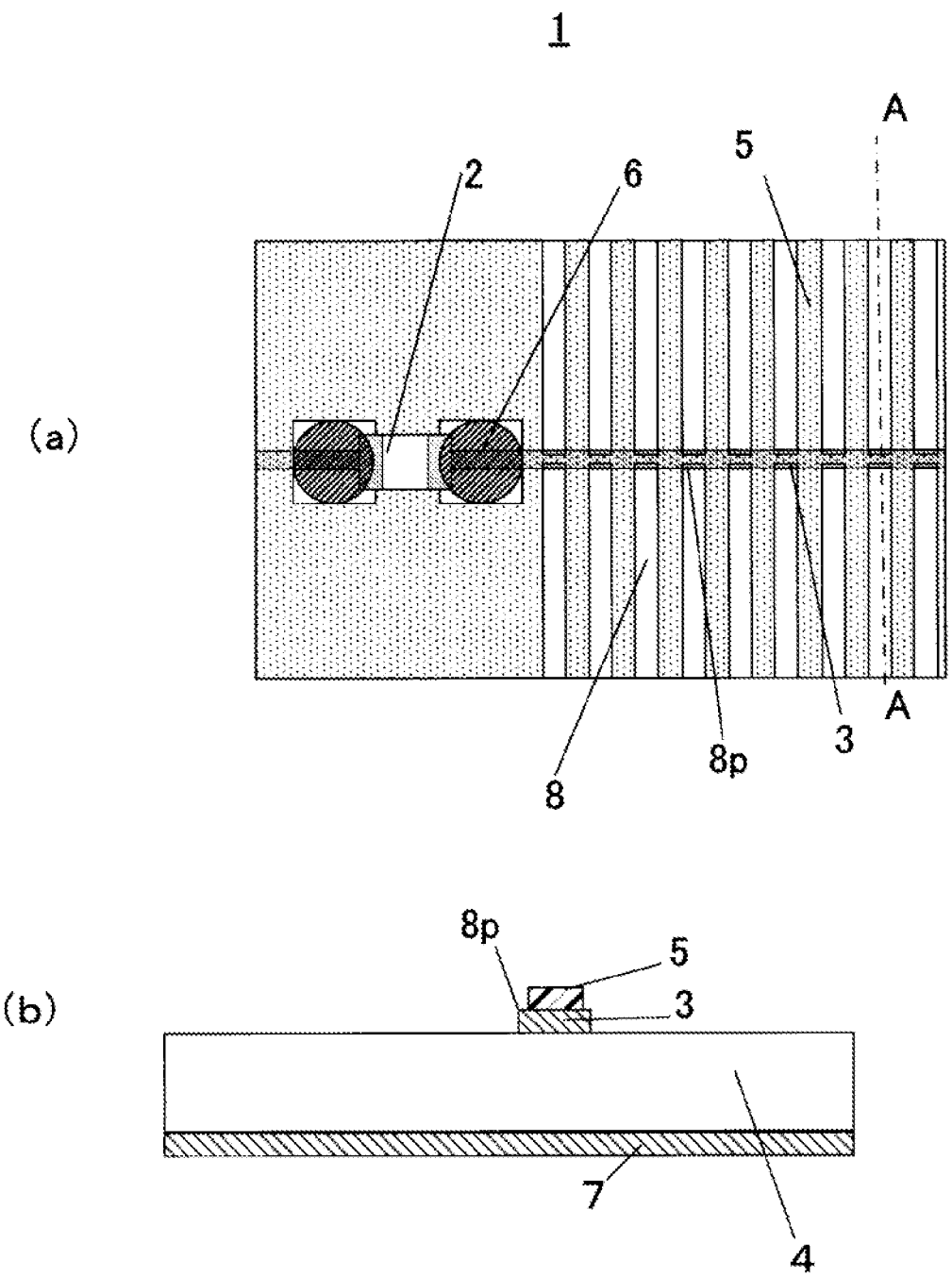
FIG. 12(a) is a top view showing a main portion configuration of a high frequency module using a high frequency module wiring board according to Embodiment 4 of the disclosure.
FIG. 12(b) is a sectional view (sectional view taken on the line A-A) cut in a wiring direction.

FIG. 12(a) and FIG. 12(b) are views showing a main portion configuration of a high frequency module using a high frequency module wiring board according to Embodiment 4 of the disclosure. FIG. 12(a) is a top view showing the main portion configuration of the high frequency module using the high frequency module wiring board according to Embodiment 4 of the disclosure, and FIG. 12(b) is a sectional view (sectional view taken on the line A-A) cut in a wiring direction.

Fundamentally in the same manner as in Embodiment 3, openings 8 are formed like stripes in a solder resist layer in the high frequency module wiring board according to Embodiment 4. The solder resist layer 5 on each wiring section 3 is left as it is, while the solder resist layer 5 on opposite sides of the wiring section 3 is removed. Thus, the opposite sides of the wiring section 3 become openings 8p.

Further, in the embodiment, the solder resist layer 5 is also removed in both side edge portions of the wiring section 3. Thus, the openings 8 are formed.

Incidentally, the other portions, for example, the configuration of the wiring section 3 are similar to those in the embodiment, and description thereof will be omitted here.

Incidentally, a major part of a current flowing in the wiring section 3 flows in the edge portions of the wiring section 3. Therefore, exposition of the edge portions is more effective in terms of the dielectric loss.

In addition, also in the embodiment, the portions to which the solder resist layer is not applied, that is, the openings are not limited to stripe-like openings, quadrangular openings or circular openings, but they may be formed as polygonal openings, for example, oval openings 8d as shown in FIG. 10.

According to the wiring board in the embodiment, in the same manner as in Embodiment 1, the solder resist layer 5 is removed not entirely but partially on the wiring of each wiring section, so that the influence of dielectric loss and the reduction in effective wavelength can be suppressed so as to suppress the increase in transmission loss and enhance the strength of the wiring. Thus, it is possible to provide a highly reliable high frequency module wiring board.

Embodiment 5

Figure 13:
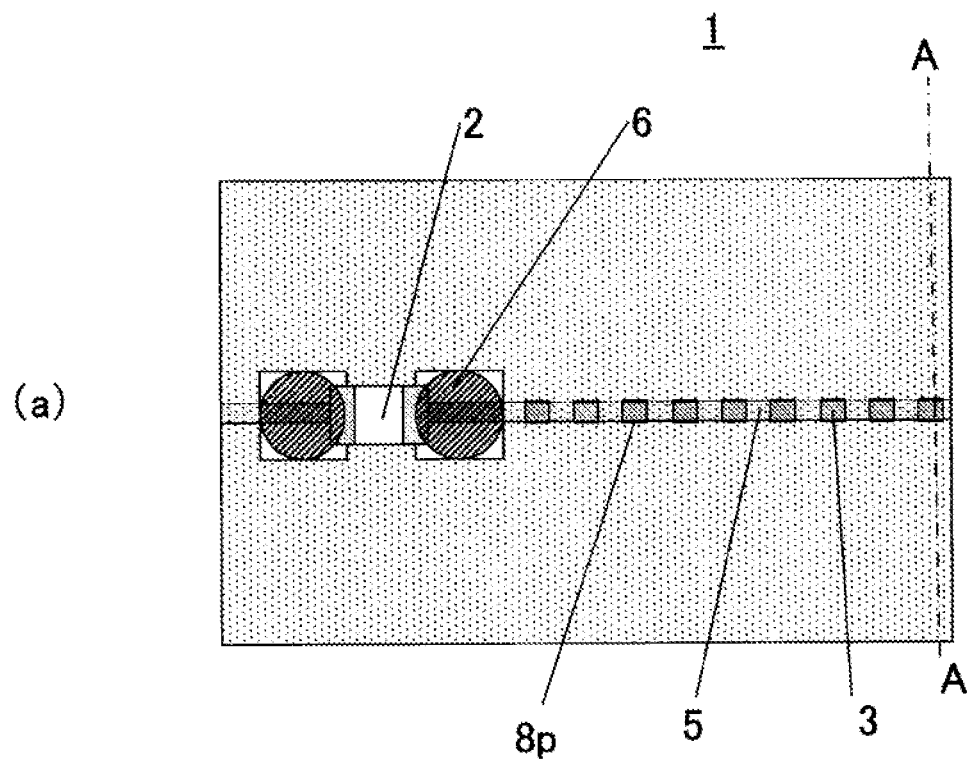
FIG. 13(a) is a top view showing a main portion configuration of a high frequency module using a high frequency module wiring board according to Embodiment 5 of the disclosure.
FIG. 13(b) is a sectional view (sectional view taken on the line A-A) cut in a wiring direction.
Figure 13:
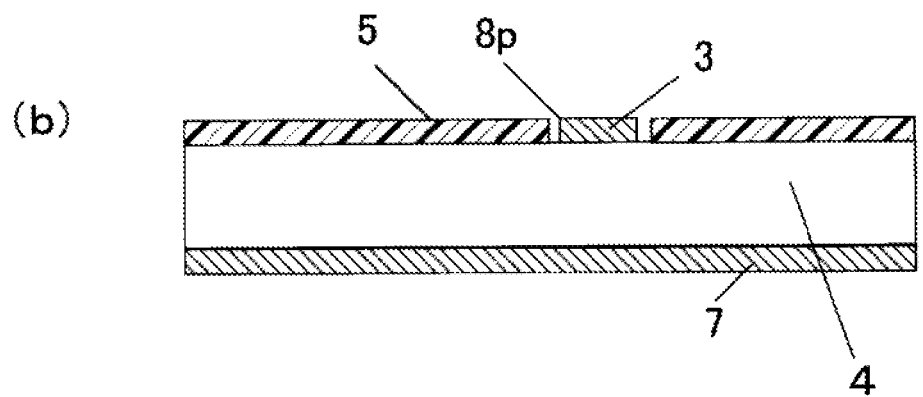

FIG. 13(a) and FIG. 13(b) are views showing a main portion configuration of a high frequency module using a high frequency module wiring board according to Embodiment 5 of the disclosure. FIG. 13(a) is a top view showing the main portion configuration of the high frequency module using the high frequency module wiring board according to Embodiment 5 of the disclosure, and FIG. 13(b) is a sectional view (sectional view taken on the line A-A) cut in a wiring direction.

In the high frequency module wiring board 1 in Embodiment 5, portions to which a solder resist layer 5 is not applied are disposed on each wiring section 3 of the wiring board 1.

Fundamentally, openings are formed at predetermined intervals in the solder resist layer 5 on the wiring section 3. In the embodiment, the solder resist layer 5 is removed in a slightly wider region than the wiring width near opposite side edge portions of the wiring section 3. Thus, openings 8p are formed.

A major part of a current flowing in the wiring section 3 flows in the edge portions of the wiring section 3. Therefore, exposition of the edge portions is more effective in terms of the dielectric loss.

Incidentally, the other portions, for example, the configuration of the wiring section 3 are similar to those in the embodiment, and description thereof will be omitted here.

In addition, also in the embodiment, the portions to which the solder resist layer is not applied, that is, the openings are not limited to stripe-like openings, quadrangular openings or circular openings, but they may be formed as polygonal openings or oval openings by way of example.

According to the wiring board in the embodiment, in the same manner as in Embodiment 1, the solder resist layer 5 is removed not entirely but partially on the wiring of each wiring section 3, so that the influence of dielectric loss and the reduction in effective wavelength can be suppressed so that the increase in transmission loss can be suppressed, the strength of the wiring can be more enhanced and the surface protection can be more enhanced. Thus, it is possible to provide a highly reliable high frequency module wiring board.

Embodiment 6

Figure 14:
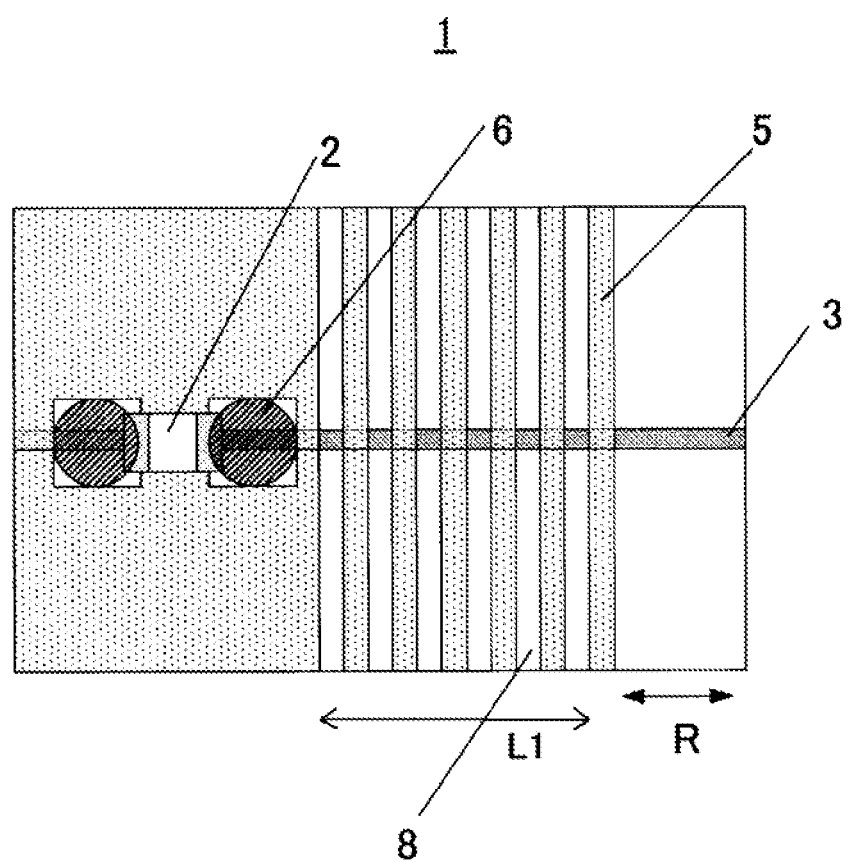
FIG. 14 is a view showing a main portion configuration of a high frequency module using a high frequency module wiring board according to Embodiment 6 of the disclosure.

FIG. 14 is a view showing a main portion configuration of a high frequency module using a high frequency module wiring board according to Embodiment 6 of the disclosure.

In the high frequency module wiring board according to Embodiment 6, after portions to which a solder resist layer is applied and portions to which the solder resist layer is not applied are disposed continuously in each wiring section 3 on the wiring board as shown in FIG. 14, a portion R to which the solder resist layer is not applied may be disposed continuously as shown in a right portion of FIG. 14.

In FIG. 14, the portions to which the solder resist layer is applied and the portions to which the solder resist layer is not applied are disposed continuously within a range of a distance $L1=\lambda g/4$ from the portion of an input/output terminal. Thus, stripe-like openings 8 are formed.

Here, for example, when the intervals of the openings are set at $\lambda g/24$ in the case where L1 is equal to $\lambda g/4$ from the portion of the input/output terminal, a plurality of openings can be formed, and further the condition that the intervals of the openings are not larger than $\lambda g/8$ as described in the embodiment can be satisfied.

Incidentally, the other portions, for example, the configuration of the wiring section are similar to those in the embodiment, and description thereof will be omitted here.

According to this configuration, the degree of freedom in pattern design of the solder resist layer is increased and the design becomes easier.

Embodiment 7

Figure 15:
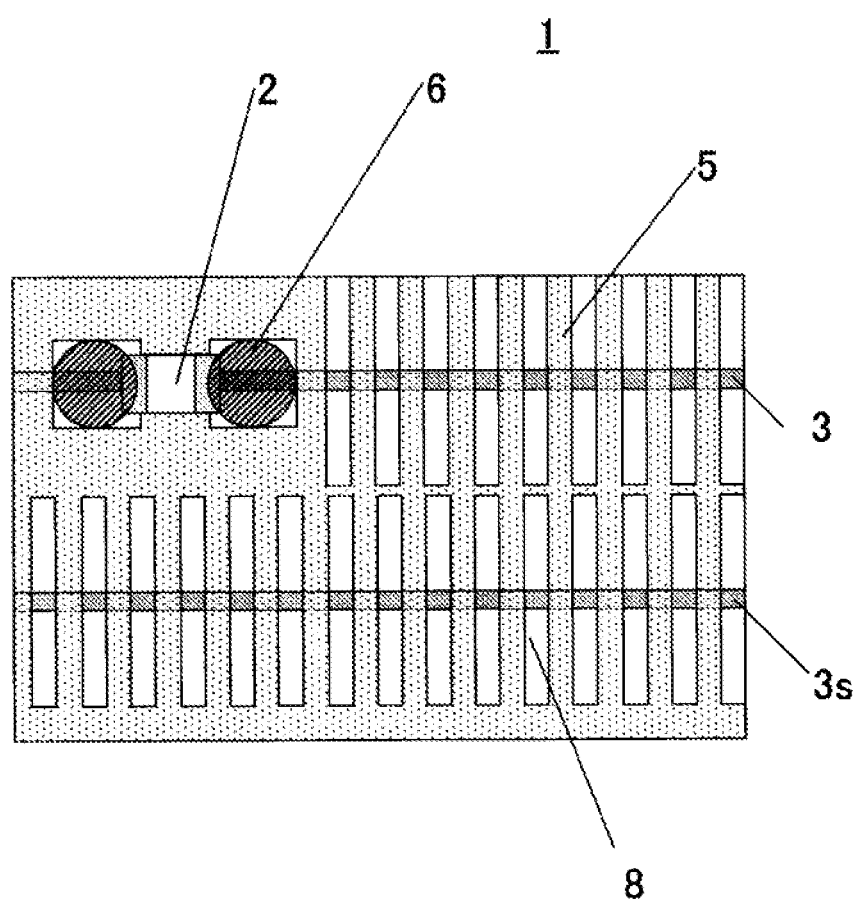
FIG. 15 is a view showing a main portion configuration of a high frequency module using a high frequency module wiring board according to Embodiment 7 of the disclosure.

FIG. 15 is a view showing a main portion configuration of a high frequency module using a high frequency module wiring board according to Embodiment 7 of the disclosure.

Figure 16:
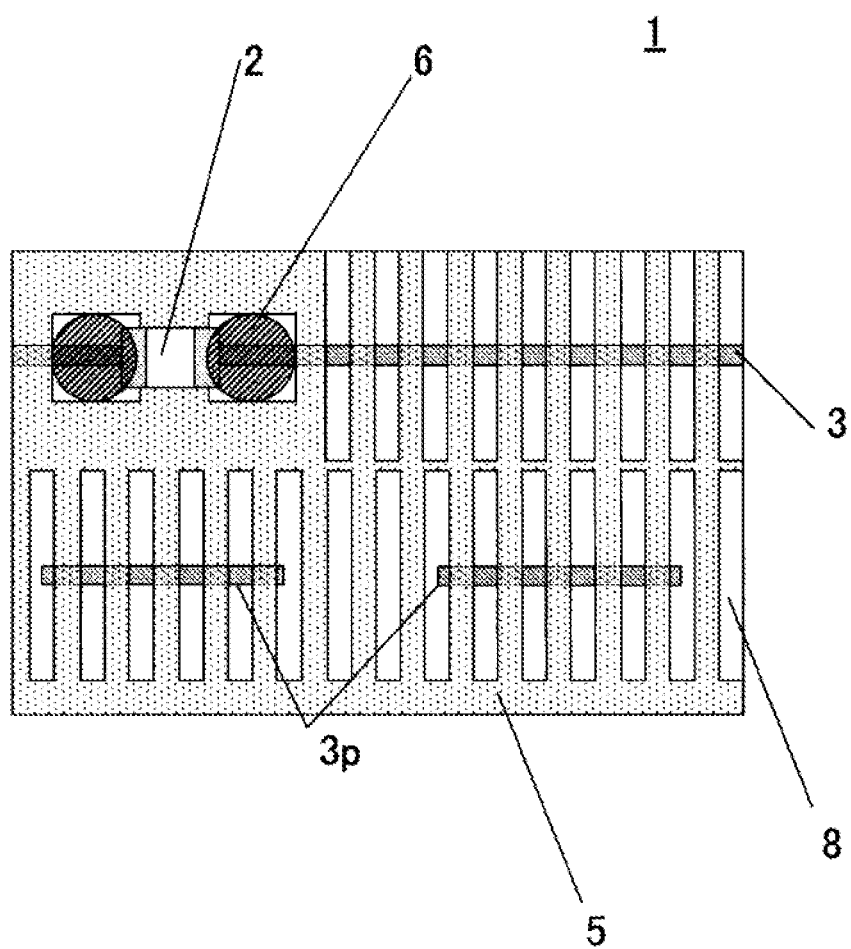
FIG. 16 is a view showing a main portion configuration of a modification of the high frequency module using the high frequency module wiring board according to Embodiment 7 of the disclosure.

In the high frequency module wiring board according to Embodiment 7, a wiring section 3s on the wiring board which is not connected directly to an SMT component as shown in FIG. 15 or a wiring section 3p on the wiring board which is not connected to any electrode of any component or another wiring as shown in FIG. 16 may be covered with a solder resist layer 5. Thus, openings 8 are formed intermittently.

Incidentally, the configurations of each wiring section and any other portion are similar to those in the embodiment, and description thereof will be omitted here.

As described above, the disclosure is also applicable to a wiring which is not connected directly to an SMT component or a wiring which is not connected to any electrode of any component or another wiring.

Embodiment 8

Figure 17:
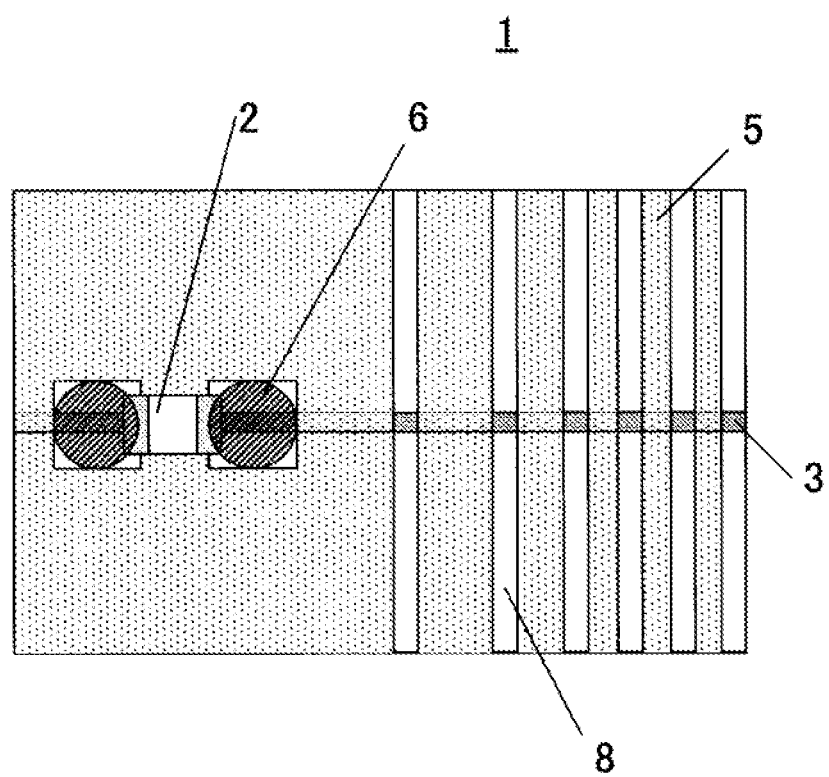
FIG. 17 is a view showing a main portion configuration of a modification of a high frequency module using a high frequency module wiring board according to Embodiment 8 of the disclosure.

FIG. 17 is a view showing a main portion configuration of a high frequency module using a high frequency module wiring board according to Embodiment 8 of the disclosure.

In the high frequency module wiring board according to Embodiment 8, the intervals with which openings 8 are disposed are formed to decrease gradually as they go away from an input/output terminal 2b of a surface mount type chip component 2 mounted on a wiring section 3 as shown in FIG. 17.

That is, the width of a solder resist layer 5 is formed to increase gradually as it goes away from the input/output terminal 2b of the surface mount type chip component 2 mounted on the wiring section 3.

Incidentally, the other portions, for example, the configuration of the wiring section, are similar to those in the embodiment, and description thereof will be omitted here.

According to this configuration, the ratio of a dielectric substance on a line is reduced stepwise so that there is an effect that reflectance can be prevented from deteriorating due to a sudden change of a dielectric constant.

Embodiment 9

Figure 18:
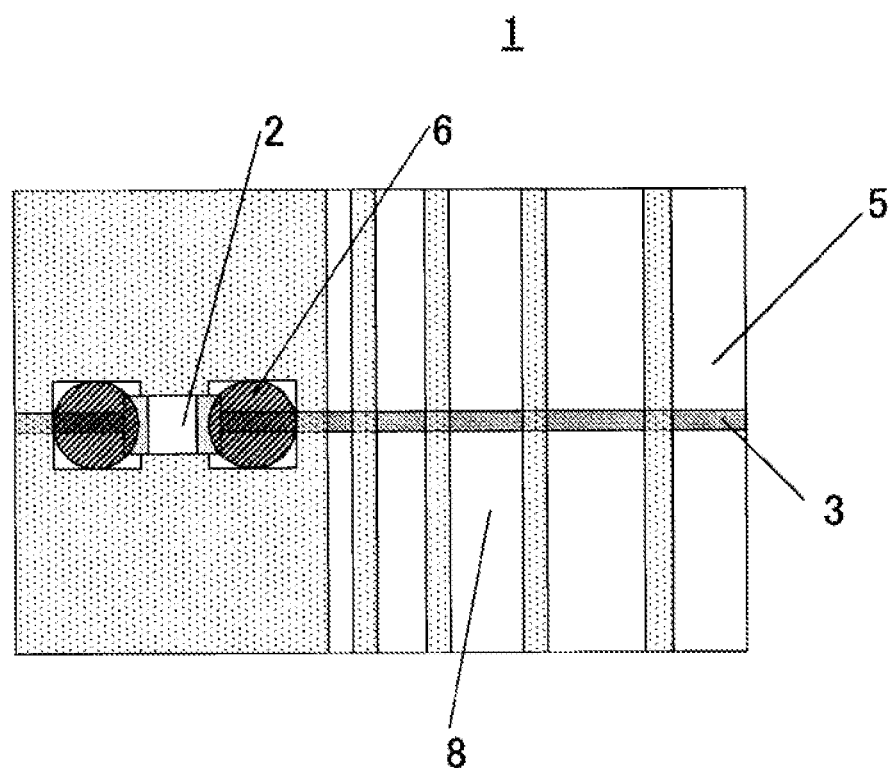
FIG. 18 is a view showing a main portion configuration of a modification of a high frequency module using a high frequency module wiring board according to Embodiment 9 of the disclosure.

FIG. 18 is a view showing a main portion configuration of a high frequency module using a high frequency module wiring board according to Embodiment 9 of the disclosure.

In the high frequency module wiring board according to Embodiment 9, the intervals of openings 8 are formed to increase gradually as they go away from an input/output terminal 2b of a surface mount type chip component 2 mounted on a wiring section 3 as shown in FIG. 18.

Incidentally, the other portions, for example, the configuration of the wiring section, are similar to those in the embodiment, and description thereof will be omitted here.

According to this configuration, the ratio of a dielectric substance on a line is reduced stepwise so that there is an effect that reflectance can be prevented from deteriorating due to a sudden change of a dielectric constant.

Embodiment 10

Figure 19:
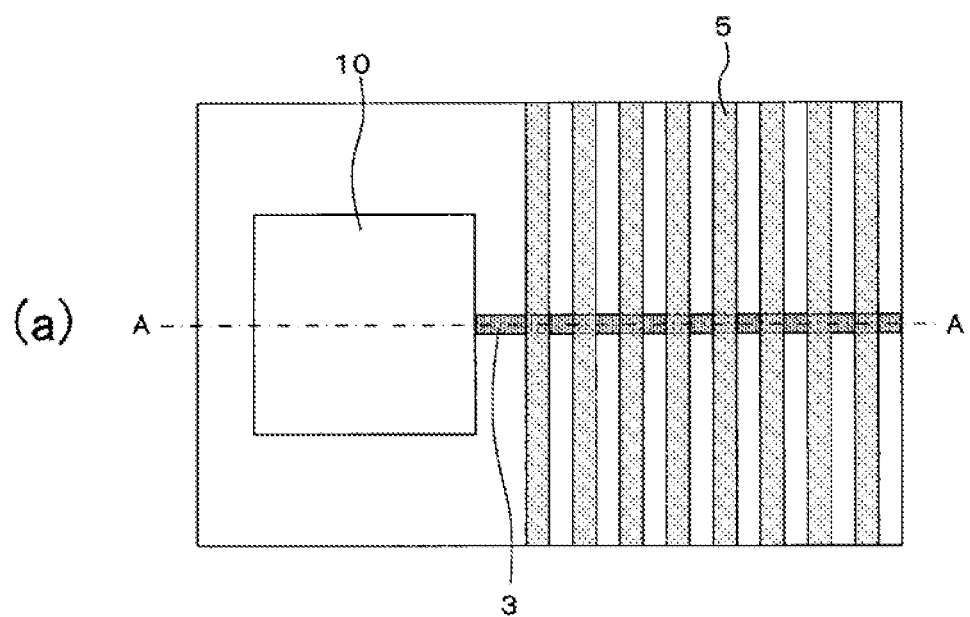
FIG. 19(a) is a view (top view) showing a main portion configuration of a high frequency module using a high frequency module wiring board according to Embodiment 10 of the disclosure.
FIG. 19(b) is a view (sectional view) cut in a wiring direction.
Figure 19:
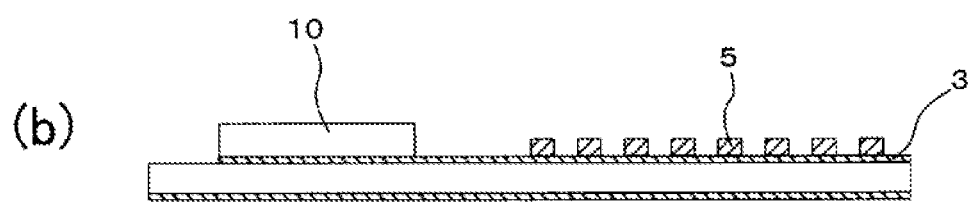

FIG. 19(a) is an explanatory view (top view) showing a main portion configuration of a high frequency module using a high frequency module wiring board according to Embodiment 10 of the disclosure, and FIG. 19(b) is an explanatory view (sectional view taken on the line A-A) cut in a wiring direction. The high frequency module shown in FIG. 19(a) is provided with an antenna element 10 in place of the surface mount type SMT component 2 provided on the high frequency module wiring board 1 according to Embodiment 1 shown in FIG. 1(a). A wiring section 3 and a solder resist layer 5 on the wiring board are similar to those in Embodiment 1. Incidentally, it is desirable that the distance between an end of the antenna element 10 and the solder resist layer 5 closest thereto is not smaller than $\lambda/8$.

Figure 20:
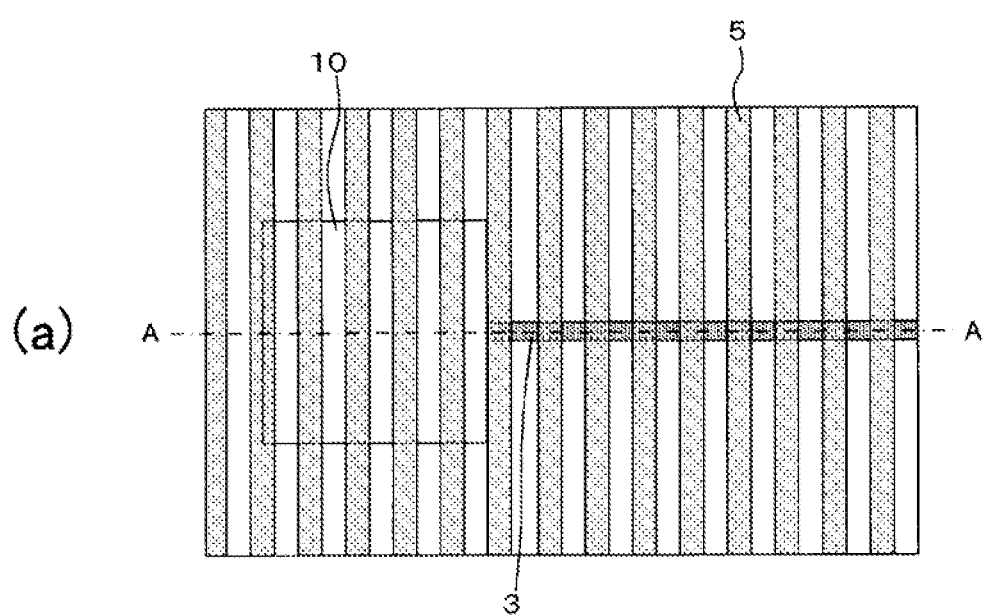
FIG. 20(a) is a view (top view) showing a main portion configuration of a modification of the high frequency module using the high frequency module wiring board according to Embodiment 10 of the disclosure.
FIG. 20(b) is a view (sectional view) cut in a wiring direction.
Figure 20:
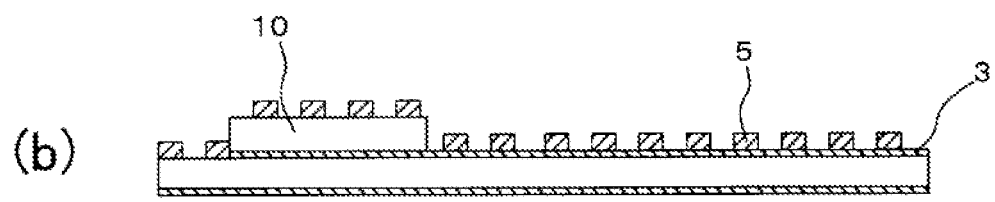

FIG. 20(a) is an explanatory view (top view) showing a main portion configuration of a high frequency module as a modification using the high frequency module wiring board according to Embodiment 10 of the disclosure, and FIG. 20(b) is an explanatory view (sectional view taken on the line A-A) cut in a wiring direction. As shown in FIG. 20(a) and FIG. 20(b), the solder resist layer 5 may be applied onto the antenna element 10 in order to enhance the mounting strength of the antenna element 10 on the wiring board.

(Circumstances for Details of Embodiments 11 to 23)

In a small-sized wireless module, a high frequency circuit chip (e.g. a wireless IC) is flip-chip mounted on a wiring board formed as a module board or a high frequency circuit chip which has been primarily mounted on a BGA (Ball Grid Array) package is secondarily mounted on a wiring board formed as a module board. Thus, the high frequency circuit chip or the BGA package is mounted on the module board. A sealing resin is injected between the wiring board and the high frequency circuit chip or the BGA package in order to enhance the mounting strength of the high frequency circuit chip or the BGA package on the wiring board to thereby enhance dust-proof and moisture-proof characteristics of the high frequency circuit chip.

However, due to the sealing resin which is a dielectric substance, impedance changes to incur signal loss or impedance mismatching when the sealing resin is present on or around a wiring in the high frequency module. A similar problem arises when a bonding agent for mounting a component or a dielectric component is present other than the sealing resin.

The "impedance" is a physical quantity designating a ratio between a voltage and a current when high frequency power is propagated through a transmission line. In addition, "matching" means matching with a condition that maximum power carried by a certain signal source can be extracted. On the contrary, "mismatching" means a state where the impedance of the certain signal source does not coincide with the impedance of a destination to which a signal is inputted.

A "reflected wave" means that the whole of electric power is not transmitted but a part of the electric power returns back in a mismatching state. A "standing wave" means that the electric power which is traveling and the electric power which is returning back are combined and canceled in specific positions.

The magnitude of reflection is expressed by a voltage reflection coefficient Γ and obtained as:

$$\Gamma=(ZX-Z0)/(ZX+Z0)$$

in which ZX designates impedance (Ω) of a subject to be measured, and Z0 designates characteristic impedance (Ω) of a measuring circuit, which is generally 50Ω.

When return loss is used and expressed:

$$\text{Return Loss (dB)}=-20\times\text{LOG}|\Gamma|$$

Lands (wiring electrodes) for mounting components are designed with impedance matching adjusted accurately in the same manner as wirings. It is however, difficult to control the positions and thicknesses of the lands because a solder resist is formed by printing with a mask.

In addition, when the wiring of the wiring board is covered with the sealing resin, the effective dielectric constant in that portion changes. Therefore, the impedance changes to incur loss due to impedance mismatching and generate a standing wave. In addition, the sealing resin used for mounting the high frequency circuit chip is low in accuracy about the mounting height of the high frequency circuit chip and the application quantity. It is therefore difficult to achieve constant impedance in that portion.

The method described in Reference Literature 1 (JP-A-63-67795) has been known as a method for reducing the influence of a solder resist. In a high frequency module according to Reference Literature 1, a solder resist is formed when a board is manufactured. After a component is mounted in a soldering process, the solder resist is removed by use of water or an organic solvent so as to prevent a characteristic change.

In addition, a sealing resin is injected between the board and the high frequency circuit chip or a BGA package in order to enhance the mounting strength of the high frequency circuit chip or the BGA package on the module board to thereby enhance dust-proof and moisture-proof characteristics of the high frequency circuit chip.

However, due to the sealing resin which is a dielectric substance, when the wiring of the module board is covered with the sealing resin, the effective dielectric constant in that portion changes. Therefore, transmission loss increases due to impedance mismatching, and a standing wave appears.

A technique described in Reference Literature 2 (JP-A-2000-269384) has been known as a technique to reduce the influence of the sealing resin. In a high frequency module described in Reference Literature 2, an insulator wall is provided to surround a circuit inside an MMIC (Monolithic Microwave Integrated Circuit) chip, and a sealing resin is applied to the outside of the insulator wall. Thus, a range covered with the sealing resin is narrowed between the wiring board and the high frequency circuit chip so that the change of the impedance can be reduced.

However, the background-art high frequency modules shown in Reference Literatures 1 and 2 have the following problems.

In Reference Literature 1, the solder resist is removed after mounting. However, since there is no coating with the solder resist, it is difficult to obtain sufficient bonding strength between the wiring and the wiring board. In addition, the wiring near the high frequency circuit chip may be coated with the sealing resin. There appears a portion where the impedance changes suddenly on the wiring. Discontinuity arises due to the portion.

On the other hand, in Reference Literature 2, a site which is not coated with a sealing resin appears in the circuit surface of the high frequency circuit chip. Thus, the effect of protection against dust and protection against moisture is spoiled. It is difficult to obtain sufficient bonding strength. In addition, the sealing resin present on the wiring of the wiring board leads to discontinuity of impedance between the area where the sealing resin is present and the area where the sealing resin is absent. It is difficult to prevent loss caused by the discontinuity of impedance and generation of a standing wave.

The disclosure has been accomplished in consideration of the actual situation. An object of the disclosure is to provide a high frequency module in which loss caused by a change of impedance of each wiring on a wiring board or generation of a standing wave can be suppressed even when an IC circuit surface of a high frequency circuit chip is entirely covered with a sealing resin.

A high frequency module 101 formed as a wireless module in an embodiment of the disclosure will be described with reference to the drawings.

Embodiment 11

Figure 21:
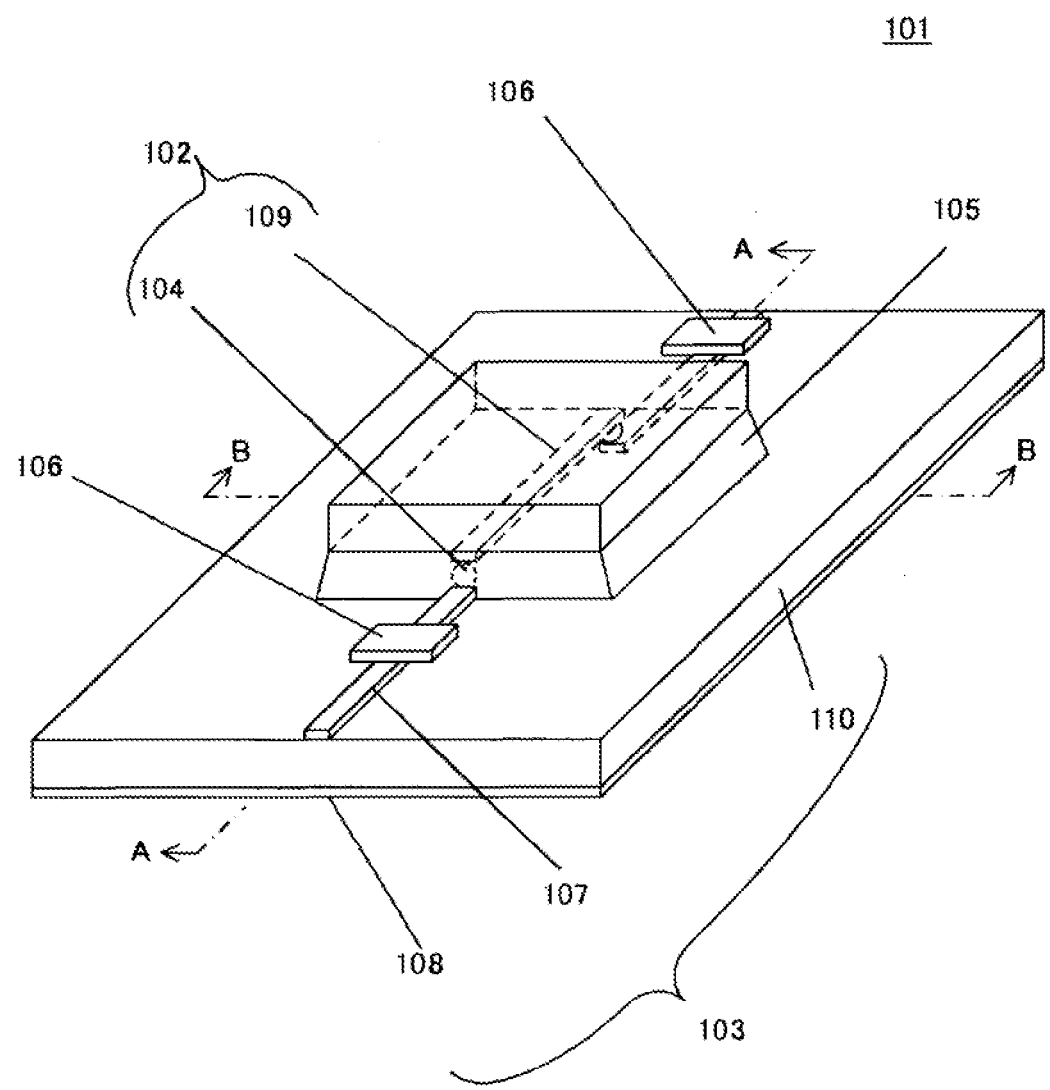
FIG. 21 is a perspective view showing a configuration of a high frequency module according to Embodiment 11 of the disclosure.
Figure 22:
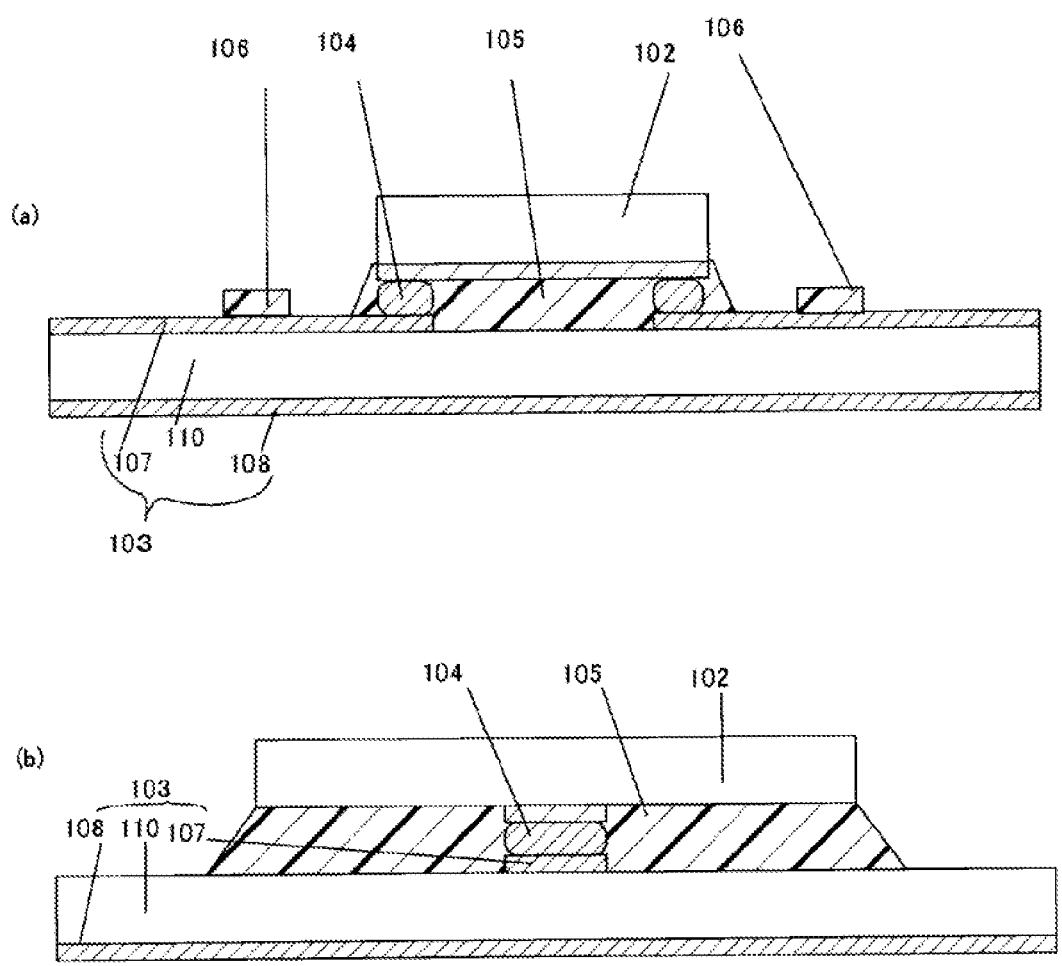
FIG. 22(a) is a sectional view taken on the line A-A in FIG. 21.
FIG. 22(b) is a sectional view taken on the line B-B in FIG. 21.

FIG. 21 is an explanatory view (perspective view) showing the configuration of the high frequency module 101 according to Embodiment 1. FIG. 22(a) and FIG. 22(b) are sectional views of FIG. 21. FIG. 22(a) is a sectional view taken on the line A-A, in which the high frequency module is cut in a wiring direction so as to include wiring sections 107. FIG. 22(b) is a sectional view taken on the line B-B. The high frequency module 101 is arranged so that a high frequency circuit (microwave or millimeter wave IC) chip 102 is mounted on a wiring board 103 serving as a module board.

Figure 37:
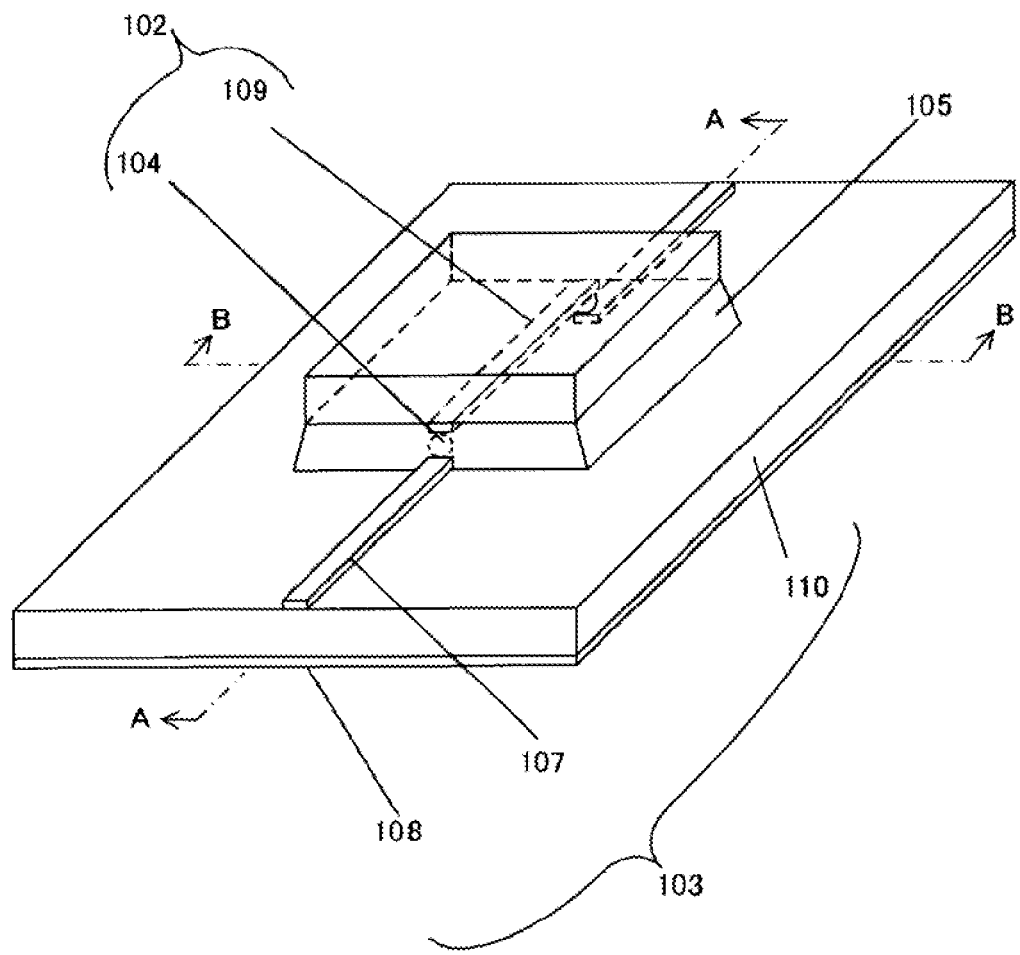
FIG. 37 is a perspective view showing a configuration of a high frequency module according to a comparative example.
Figure 38:
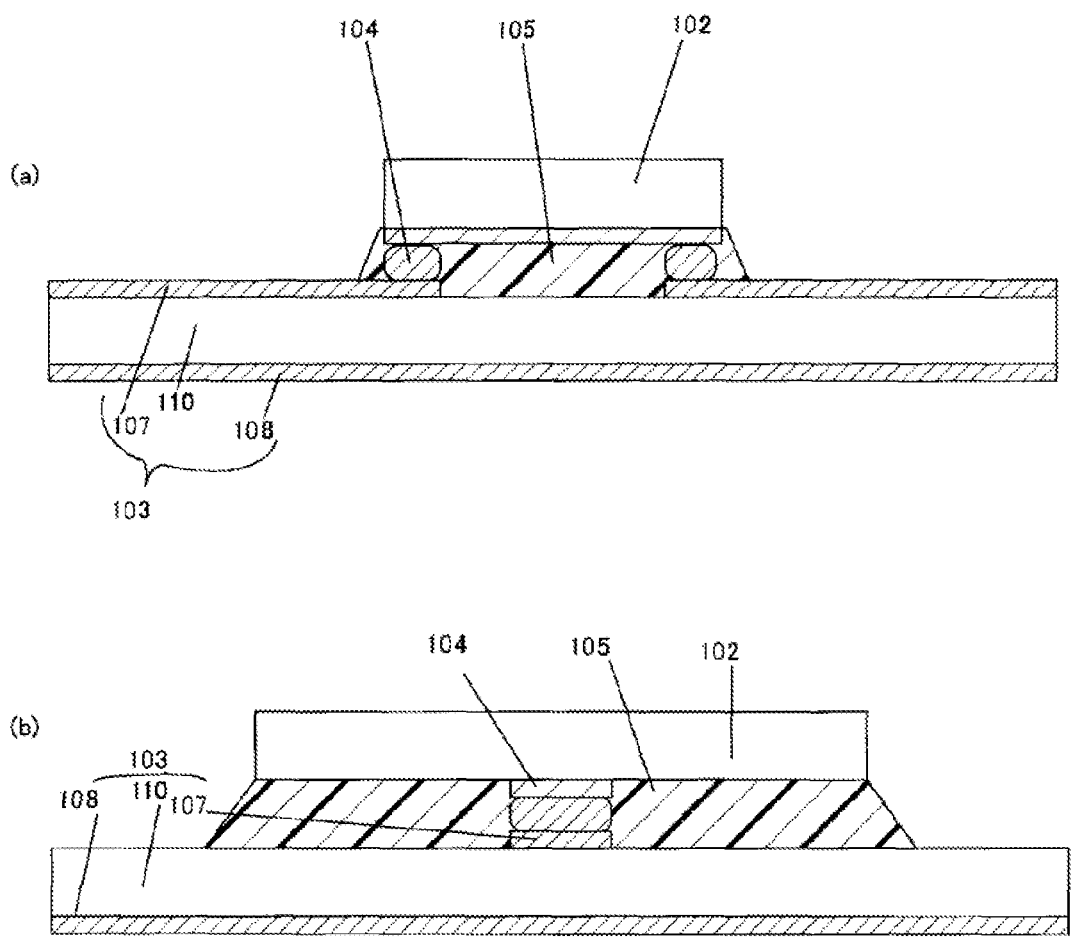
FIG. 38(a) is a sectional view taken on the line A-A in FIG. 37.
FIG. 38(b) is a sectional view taken on the line B-B in FIG. 37.

FIG. 21, FIG. 22(a) and FIG. 22(b) show an example of flip-chip mounting, in which the high frequency circuit chip 102 is mounted upside down so that a circuit formation surface of the high frequency circuit chip 102 is opposed to the wiring board 103. In the high frequency module 101 according to the embodiment shown in FIG. 21, FIG. 22(a) and FIG. 22(b), impedance adjustor circuits 106 are disposed outside a portion where the high frequency circuit chip 102 is mounted, that is, outside input/output terminals 104. FIG. 37, FIG. 38(a) and FIG. 38(b) are comparative views. FIG. 37 is an explanatory view (perspective view) showing a configuration of a high frequency module in which the impedance adjustor circuits 106 are not formed. FIG. 38(a) is a sectional view taken on the line A-A, in which the high frequency module is cut in a wiring direction so as to include the wiring sections 107. FIG. 38(b) is a sectional view taken on the line B-B, in which the high frequency module is cut in a direction perpendicular to the wirings.

The high frequency module 101 according to the embodiment includes the high frequency circuit chip 102, and the wiring board 103 which is provided with the wiring sections 107 for flip-chip connecting bumps serving as the input/output terminals 104 of the high frequency circuit chip 102. A sealing resin 105 is charged between the wiring board 103 and the high frequency circuit chip 102. The impedance adjustor circuits 106 are provided outside the input/output terminals 104 and within a predetermined range of the wiring sections 107 of the wiring board 103.

In the flip-chip mounting, the circuit surface of the high frequency circuit chip 102 is opposed to the wiring board 103, and electrodes in a chip wiring 109 on the high frequency circuit chip 102 are connected to the wiring sections 107 on the wiring board 103 in metal protrusions (input/output terminals 104) called bumps. A thermosetting resin (e.g. an epoxy resin) referred to as the sealing resin 105 is injected between the high frequency circuit chip 102 and the wiring board 103 so as to enhance the mounting strength of the high frequency circuit chip 102 on the wiring board 103, and further coat the circuit surface of the high frequency circuit chip 102 with the resin to thereby obtain an effect of protection against water or moisture and protection against dust.

Each of the impedance adjustor circuits 106 is formed using a dielectric layer including a solder resist and provided to cover corresponding one of the wiring sections 107 so as to be located at a predetermined distance from corresponding one of the input/output terminals 104. For example, the dielectric layer has a width W of 0.3 mm, a length L of 0.5 mm and a thickness T of 0.02 mm. The dielectric constant of the dielectric layer is, for example, 3.4. The predetermined distance from each input/output terminal 104 is set at a region within $\lambda g/4$. In the wiring board 103, the wiring sections 107 are formed on a front surface of a dielectric substrate 110 (for example, a resin substrate or a ceramic substrate), and the whole of a back surface of the dielectric substrate 110 is formed as a ground layer 108 so as to form a ground-coplanar structure.

An example of the position of each impedance adjustor circuit 106 can be expressed by use of a signal wavelength $\lambda g=1/(f\cdot\sqrt{\in r})$ on the wiring board 103, where $f$ designates the signal frequency for transmission in the wiring on the module board, that is, the wiring board 103, and $\in r$ designates the effective dielectric constant of the wiring board 103.

The impedance adjustor circuit 106 is placed more closely to the input/output terminal 104, that is, the bump (electrode) on the high frequency circuit chip 102 than a position at a distance of about $\lambda g/4$ therefrom. As shown in FIGS. 23 to 26, it is desirable that the dimensions in the case where in which a plurality of dielectric patterns are arrayed are formed so that, for example, the width and interval of the dielectric material are set at $\lambda g/16$ respectively. This is because the number of pairs of "dielectric pattern presence" and "dielectric pattern absence" is only one in the case of $\lambda g/8$ when the distance is $\lambda g/4$. Therefore, the width and interval of the dielectric material are set at $\lambda g/16$ here in order to repeat "dielectric pattern presence" and "dielectric pattern absence" twice (a plurality of times).

According to the high frequency module 101 in the embodiment, the impedance may be displaced from its design value to incur mismatching due to the sealing resin existing on the chip wiring 109 (high frequency wiring) connected to the electrodes of the high frequency circuit chip 102.

Therefore, the impedance adjustor circuits 106 are placed on the wiring sections 107 of the wiring board 103 so as to relax the impedance mismatching. Thus, it is possible to obtain a high frequency module in which the propagation loss and the occurrence of a standing wave caused by the impedance mismatching can be reduced.

Consider the case where a signal line and a load with load impedance Z are connected to opposite ends of a transmission line whose characteristic impedance is Z0. A voltage standing wave ratio (VSWR) on the load side is expressed by the following expressions:

$VSWR=(1+|\Gamma|)/(1-|\Gamma|)$ $\Gamma=(Z-Z0)/(Z+Z0)=V2/V1$ in which V1 designates the amplitude voltage of a traveling wave, V2 designates the amplitude voltage of a reflected wave, and $\Gamma$ designates a voltage reflection coefficient. VSWR takes 1 when the characteristic impedance of the transmission line coincides with the load impedance, that is, at Z0=Z.

In the high frequency signal (traveling wave) sent out from the signal line to the transmission line, when there is discontinuity (mismatching) of impedance between the transmission line and the load, reflection of the signal occurs in the portion of the discontinuity, so that a component (reflected wave) traveling reversely in the transmission line occurs.

The traveling wave and the reflected wave are added to each other in the transmission line. Since the frequencies of those waves are equal to each other, oscillation with fixed nodes is observed in the transmission line. This is called a standing wave. A standing wave ratio expresses the degree of oscillation of the standing wave, and hence indicates the degree of reflection of the high frequency signal.

In wireless equipment or particularly in transmission equipment, the transmission line, the signal line and the load can be replaced by a feeder line, a transmitter line and an antenna respectively.

For example, on the assumption that a change in effective dielectric constant caused by the sealing resin is twice, the impedance changes from 50Ω to 25Ω. Thus, $\Gamma=(25-50)/(25+50)=-0.33$ Return loss is 9.6 dB. On the other hand, when the impedance adjustor circuits are placed, for example, the return loss (dB)=$-20\times LOG|\Gamma|$ can be improved to 16.9 dB. Here, VSWR is 1.98. It will go well if VSWR is not higher than 2.

Next, description will be made about a method for forming each impedance adjustor circuit 106.

In the design of the wiring board 103, impedance is taken into consideration. A wiring pattern and a dielectric pattern are designed, and the size and position of a pattern of a solder resist are calculated to form a mask.

After the wiring board 103 is formed, a solder resist layer is formed as the dielectric pattern by use of the mask. Thus, the wiring board 103 provided with the impedance adjustor circuit 106 can be formed easily.

After the high frequency circuit chip 102 or another surface mount component (SMT) is mounted using the wiring board 103, VSWR is measured, and the solder resist pattern is deleted or added in accordance with a measured value, so as to be finely adjusted. Thus, a high frequency module 101 more excellent in transmission characteristics is formed.

In addition, for example, another dielectric material of a resist or silk than the solder resist may be used as the dielectric substance. To obtain the dielectric substance using the dielectric material of a resist or silk, the mask for forming the pattern in the manufacturing process of the wiring board 103 may be changed in accordance with the dielectric material. In addition, a desired dielectric substance (e.g. a resin film or dielectric paste) may be applied after the wiring board 103 is manufactured. When the heating temperature and the heating time after the application are adjusted to control the dripping degree of the dielectric substance, the impedance can be adjusted.

In order to achieve further higher precision, the dielectric pattern using the solder resist to form the impedance adjustor circuit 106 is added or deleted for adjustment to make VSWR as dose to 1 as possible while VSWR is measured.

As described above, according to the embodiment, it is possible to improve the voltage standing wave ratio (VSWR).

In addition, as methods for mounting an IC chip (e.g. high frequency circuit chip), for example, there are flip-chip mounting for mounting the IC chip upside down and face-up mounting for mounting the IC chip with its circuit surface up. Either method may be applied to the embodiment.

Although a solder resist is used as the dielectric pattern in Embodiment 11, the dielectric pattern is not limited to the solder resist but, for example, an epoxy resin may be used as a thermosetting resin or, for example, a polycarbonate resin or a polyethylene resin may be used as a thermoplastic resin.

Embodiment 12

Next, description will be made about a high frequency module according to Embodiment 12 of the disclosure.

Figure 23:
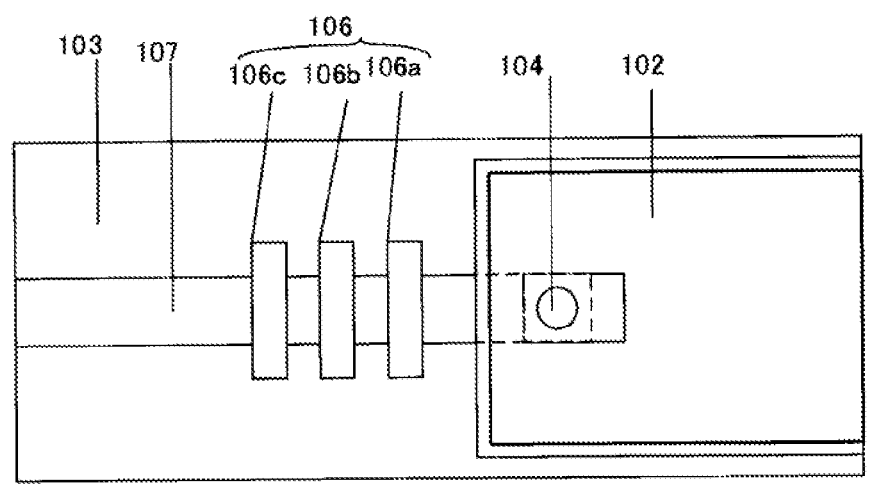
FIG. 23 is a top view showing a configuration of a high frequency module according to Embodiment 12 of the disclosure.

Although one impedance adjustor circuit 106 is disposed on each wiring section 107 of the wiring board 103 in the Embodiment 11 as shown in FIG. 21, FIG. 22(a) and FIG. 22(b) by way of example, a plurality of relaxation structures may be arrayed to change the impedance gradually as shown in FIG. 23.

Figure 39:
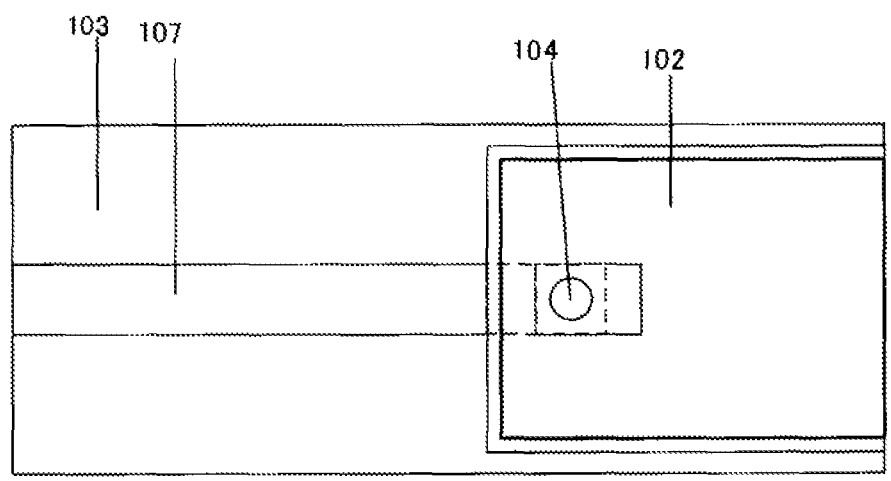
FIG. 39 is a view showing a main portion top view showing a configuration of a high frequency module according to a comparative example.

FIG. 23 is a top view showing a main portion of the high frequency module according to Embodiment 12. FIG. 23 illustrates an example of flip-chip mounting. FIG. 39 is a comparative view. FIG. 39 is a top view showing a configuration of a high frequency module in which the impedance adjustor circuit 106 is not formed.

Although a dielectric layer pattern as the impedance adjustor circuit 106 is disposed on each wiring section 107 on the wiring board 103 in the high frequency module 101 according to the Embodiment 11, three dielectric layer patterns 106a, 106b and 106c are disposed in the embodiment.

According to the configuration, a plurality of patterns are disposed in the extending direction of the wiring section so that the impedance can be changed gradually.

The other portions are similar to those in the embodiment, and description thereof will be omitted here.

Embodiment 13

Next, description will be made about a high frequency module according to Embodiment 13 of the disclosure.

Figure 24:
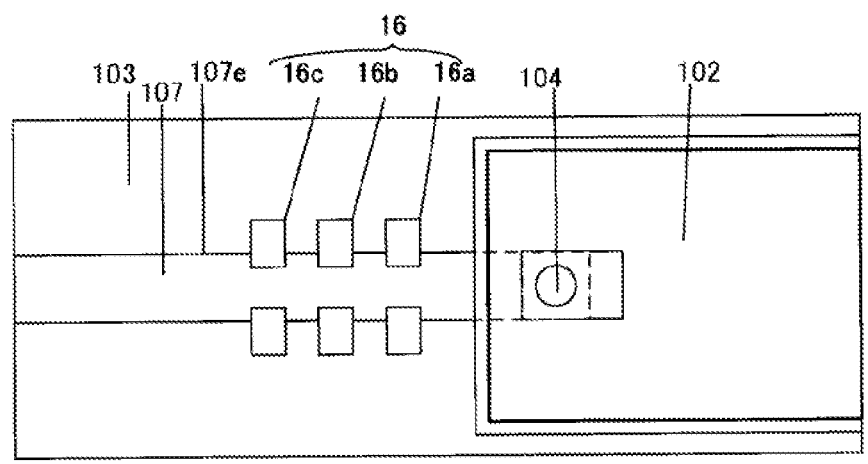
FIG. 24 is a top view showing a configuration of a high frequency module according to Embodiment 13 of the disclosure.

FIG. 24 is a top view showing a main portion of the high frequency module according to Embodiment 13.

Although a dielectric layer pattern as the impedance adjustor circuit 106 is disposed to cover the wiring section 107 all over the wiring width of the wiring section on the wiring board 103 in the embodiment, three dielectric layer patterns 16a, 16b and 16c are disposed to cover each edge 107e of the wiring section 107 in the embodiment.

Also according to the embodiment, a plurality of dielectric layer patterns are disposed in the extending direction of the wiring section 107 on the wiring board 103 so that the impedance can be changed gradually.

The other portions are similar to those in the embodiment, and description thereof will be omitted here.

Here, a current/electric field distribution on a line concentrates at line ends (end portions in the current direction: edges 107e). Therefore, an effect of impedance adjustment can be obtained when a dielectric layer is disposed in each edge portion. In addition, since the area of the impedance adjustor circuit is reduced, the processing time for example, for application using a dispenser is shortened. Accordingly, the manufacturing cost can be suppressed.

Incidentally, two patterns of a dielectric layer forming the impedance adjustor circuit may be arrayed in two edges (edges 107e) of the wiring section 107.

As described above, also according to the configuration of the embodiment, a current flows in concentration near the line edges (edges 107e). Therefore, when the dielectric layer covers the vicinities of the line edges (edges 107e), the discontinuity of impedance can be relaxed. Accordingly, also in the embodiment, a similar effect to that in the Embodiment 12 can be obtained.

Embodiment 14

Figure 25:
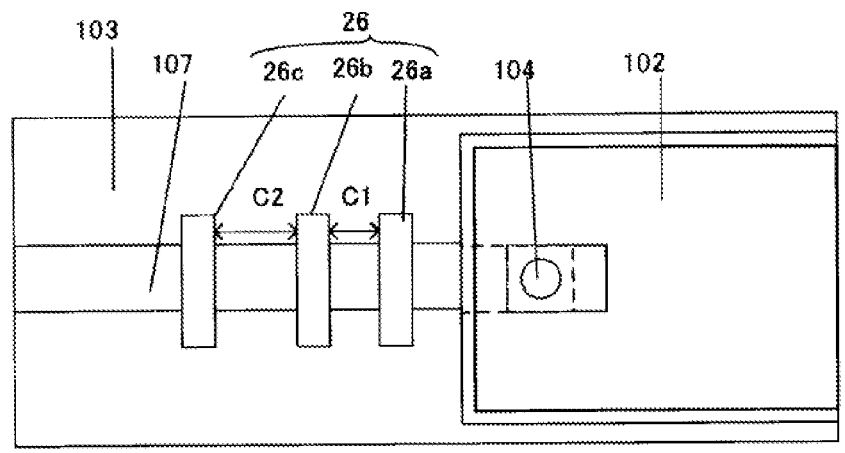
FIG. 25 is a top view showing a configuration of a high frequency module according to Embodiment 14 of the disclosure.

Next, description will be made about a high frequency module according to Embodiment 14 of the disclosure. FIG. 25 is a top view showing a main portion of the high frequency module according to Embodiment 14.

In the embodiment, three dielectric layer patterns 26a, 26b and 26c which are dielectric layer patterns having the same sizes are disposed so that distances C1 and C2 increase gradually as they go away from the input/output terminal 104 of the high frequency circuit chip 102 (C1<C2).

Also according to the configuration, the dielectric layer patterns 26a, 26b and 26c are disposed with the distances C increasing gradually as they go away from the input/output terminal 104 of the high frequency circuit chip 102 so that the impedance can be changed gradually. Thus, the discontinuity of impedance can be relaxed.

Embodiment 15

Figure 26:
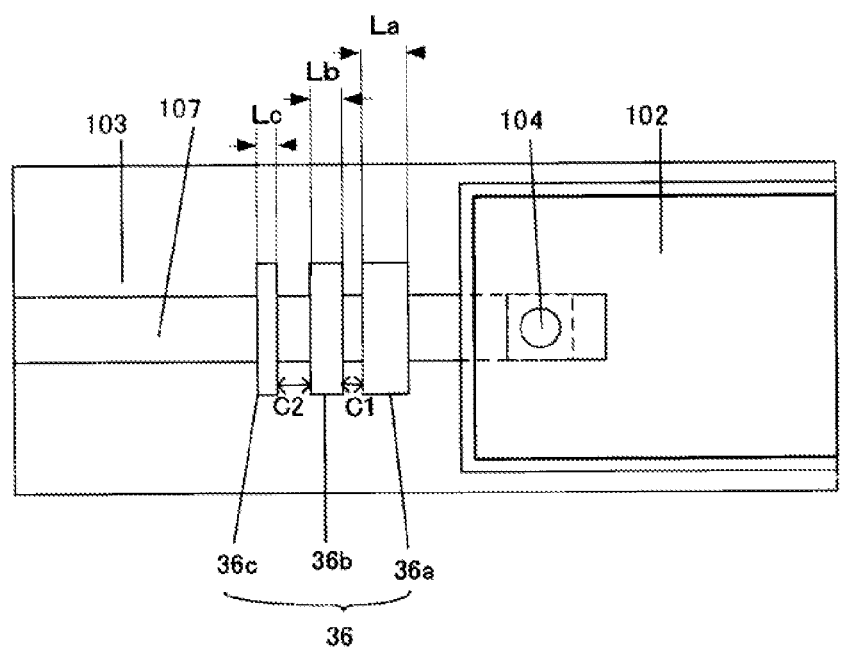
FIG. 26 is a top view showing a configuration of a high frequency module according to Embodiment 15 of the disclosure.

Next, description will be made about a high frequency module according to Embodiment 15 of the disclosure. FIG. 26 is a top view showing a main portion of the high frequency module according to Embodiment 15.

In the embodiment, three dielectric layer patterns 36a, 36b and 36c which are dielectric layer patterns with lengths La, Lb and Lc (La>Lb>Lc) decreasing gradually are disposed as an impedance adjustor circuit 36. That is, the areas of the three dielectric layer patterns decrease gradually.

Also according to the configuration, the lengths La, Lb and Lc decrease gradually, that is, the pattern areas decrease gradually as they go away from the input/output terminal 104 of the high frequency circuit chip 102. Therefore, the impedance is changed gradually. Thus, the discontinuity of the impedance can be relaxed more smoothly.

Further, also in the embodiment, in the same manner as in the Embodiment 13, the three dielectric layer patterns 36a, 36b and 36c are disposed with the distances C1 and C2 increasing gradually as they go away from the input/output terminal 104 of the high frequency circuit chip 102 (C1<C2).

Embodiment 16

Next, description will be made about a high frequency module according to Embodiment 16 of the disclosure.

Figure 27:
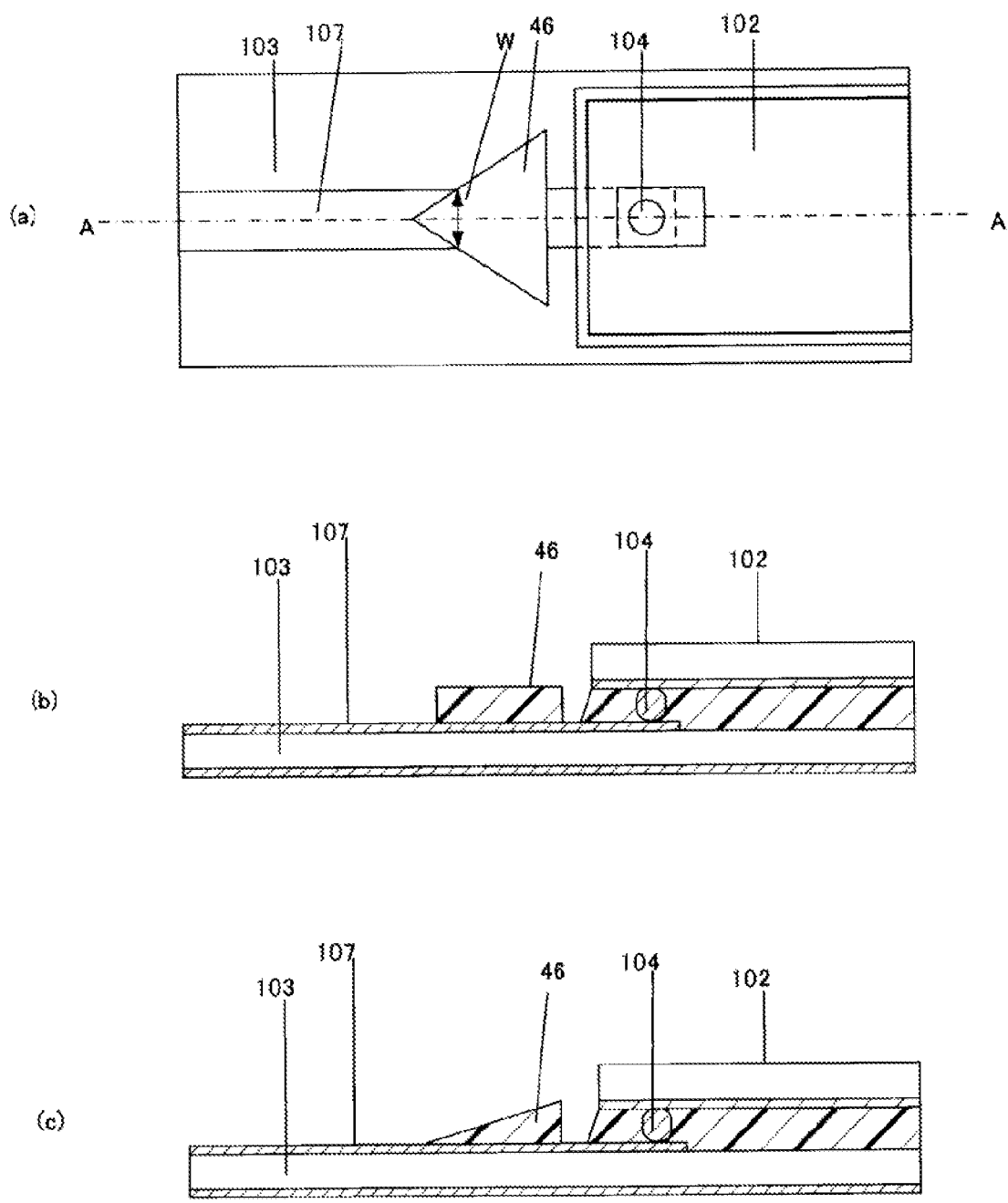
FIG. 27(a) to FIG. 27(c) are views showing a configuration of a high frequency module according to Embodiment 16 of the disclosure, FIG. 27(a) being a top view, FIG. 27(b) being a sectional view taken on the line A-A in FIG. 27(a), FIG. 27(c) being a sectional view showing a modification of FIG. 27(b).

FIG. 27(a) to FIG. 27(c) are views showing a main portion of the high frequency module according to Embodiment 16. FIG. 27(a) is a top view, and FIG. 27(b) is a sectional view taken on the line A-A in FIG. 27(a).

In the embodiment, a dielectric layer pattern whose dielectric pattern width W in a region covering the wiring section 107 on the wiring board 103 decreases gradually as it goes outward from the position of a bump forming the input/output terminal 104 is used as an impedance adjustor circuit 46.

Also according to this configuration, the arrangement is made so that the dielectric pattern width W in the region covering the wiring section 107 decreases gradually as it goes away from the input/output terminal 104 of the high frequency circuit chip 102. The dielectric pattern area also decreases gradually, and the impedance is changed gradually. Thus, the discontinuity of the impedance can be relaxed. The dielectric pattern can be formed easily by patterning with a mask.

In a modification as shown in FIG. 27(c), the thickness may be also reduced gradually as it goes away from the input/output terminal 104 of the high frequency circuit chip 102, in addition to the dielectric pattern width W in the region covering the wiring section 107. The gradual change of the impedance can be made further smooth.

Embodiment 17

Next, description will be made about a high frequency module according to Embodiment 17 of the disclosure.

FIG. 28(a) and FIG. 28(b) are views showing a main portion of the high frequency module according to Embodiment 17. FIG. 28(a) is a top view, and FIG. 28(b) is a sectional view taken on the line A-A in FIG. 28(a).

In the embodiment, three dielectric layer patterns 56a, 56b and 56c covering the wiring section are used as an impedance adjustor circuit 56. The thicknesses (film thicknesses) Ta, Tb and Tc of the dielectric layer patterns decrease gradually as they go away from the input/output terminals 104 of the high frequency circuit chip 102. The film thicknesses Ta, Tb and Tc of the three dielectric layer patterns 56a, 56b and 56c have a relation of the following expression.

$$(Ta > Tb > Tc)$$

In the embodiment, for example, an epoxy resin is used as a thermosetting resin for forming the dielectric layer patterns having different film thicknesses, and the film thicknesses are changed sequentially. For formation based on an application method, a method in which a mask having selective openings is prepared and a resin is charged into the openings of the mask is used. When application is performed a plurality of times in any region in which the film thickness should be made thicker, the dielectric layer patterns having the film thicknesses changed sequentially can be formed easily.

Also according to the configuration, the discontinuity of impedance can be relaxed more smoothly. In addition, the dielectric layer patterns may be formed using a solder resist as the dielectric layer or by an application method.

Embodiment 18

Next, description will be made about a high frequency module according to Embodiment 18 of the disclosure.

Figure 29:
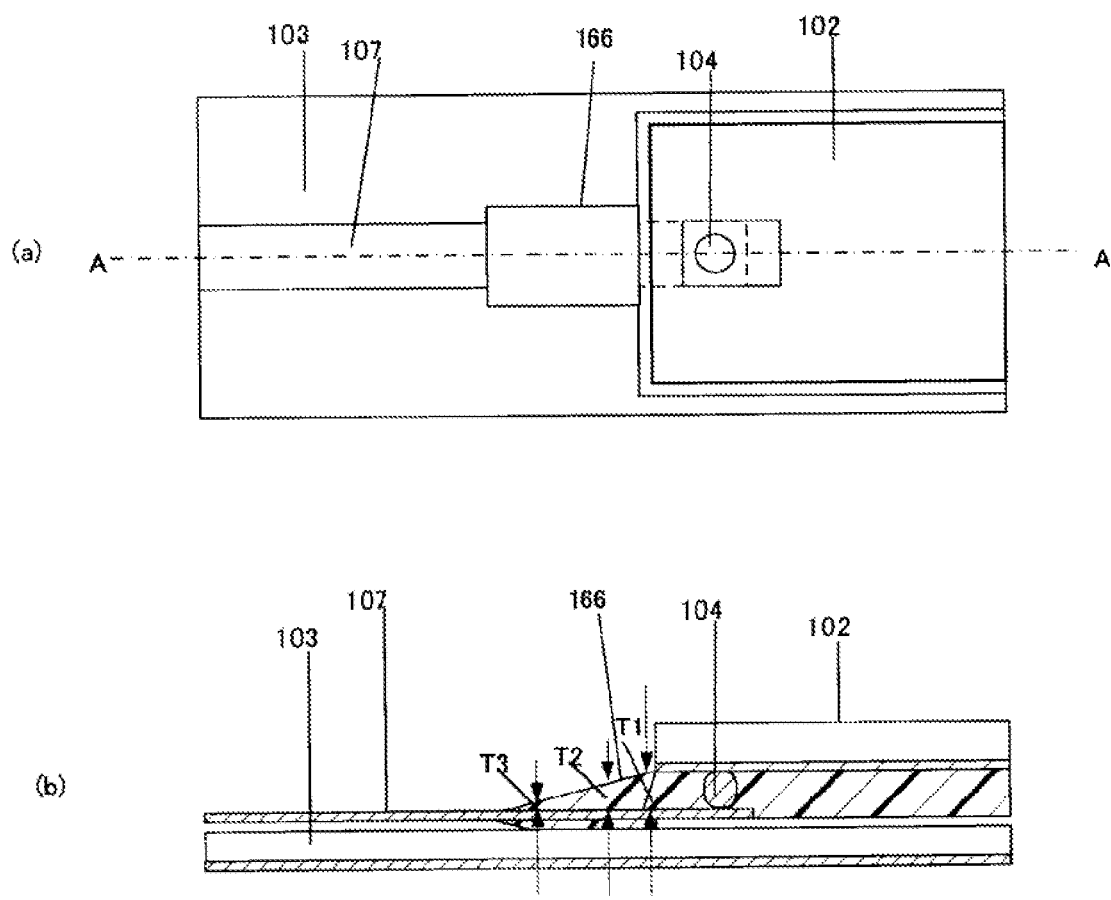
FIG. 29(a) and FIG. 29(b) are views showing a configuration of a high frequency module according to Embodiment 18 of the disclosure, FIG. 29(a) being a top view, FIG. 29(b) being a sectional view taken on the line A-A in FIG. 29(a).

FIG. 29(a) and FIG. 29(b) are views showing a main portion of the high frequency module according to Embodiment 18. FIG. 29(a) is a top view, and FIG. 29(b) is a sectional view taken on the line A-A in FIG. 29(a).

In the embodiment, one dielectric layer pattern covering the wiring section is used as an impedance adjustor circuit 166. The thickness T of the dielectric layer pattern decreases gently. T1, T2 and T3 as the film thickness of the dielectric layer in positions in order of increasing distance from the input/output terminal have a relation of the following expression.

$$T1 > T2 > T3$$

Also in the embodiment, for example, an epoxy resin may be used as a thermosetting resin for forming the dielectric layer pattern whose film thickness varies, and the film thickness may be changed sequentially in the same manner as in the Embodiment 17. For formation based on an application method, a method in which a mask having an opening formed in accordance with a circuit design is prepared and a resin is charged into the opening of the mask is used. When application is performed a plurality of times in any region in which the film thickness should be made thicker, the dielectric layer pattern can be formed easily.

Also according to the configuration, the discontinuity of impedance can be relaxed further smoothly.

As described above, various forms can be used as the impedance adjustor circuit as shown in Embodiments 12 to 18.

For example, a plurality of dielectric patterns may be arrayed at intervals changed gradually, or the areas of the dielectric patterns may be changed gradually. Alternatively, a triangular pattern may be arranged so that the width covering the wiring section can be changed gradually.

Figure 28:
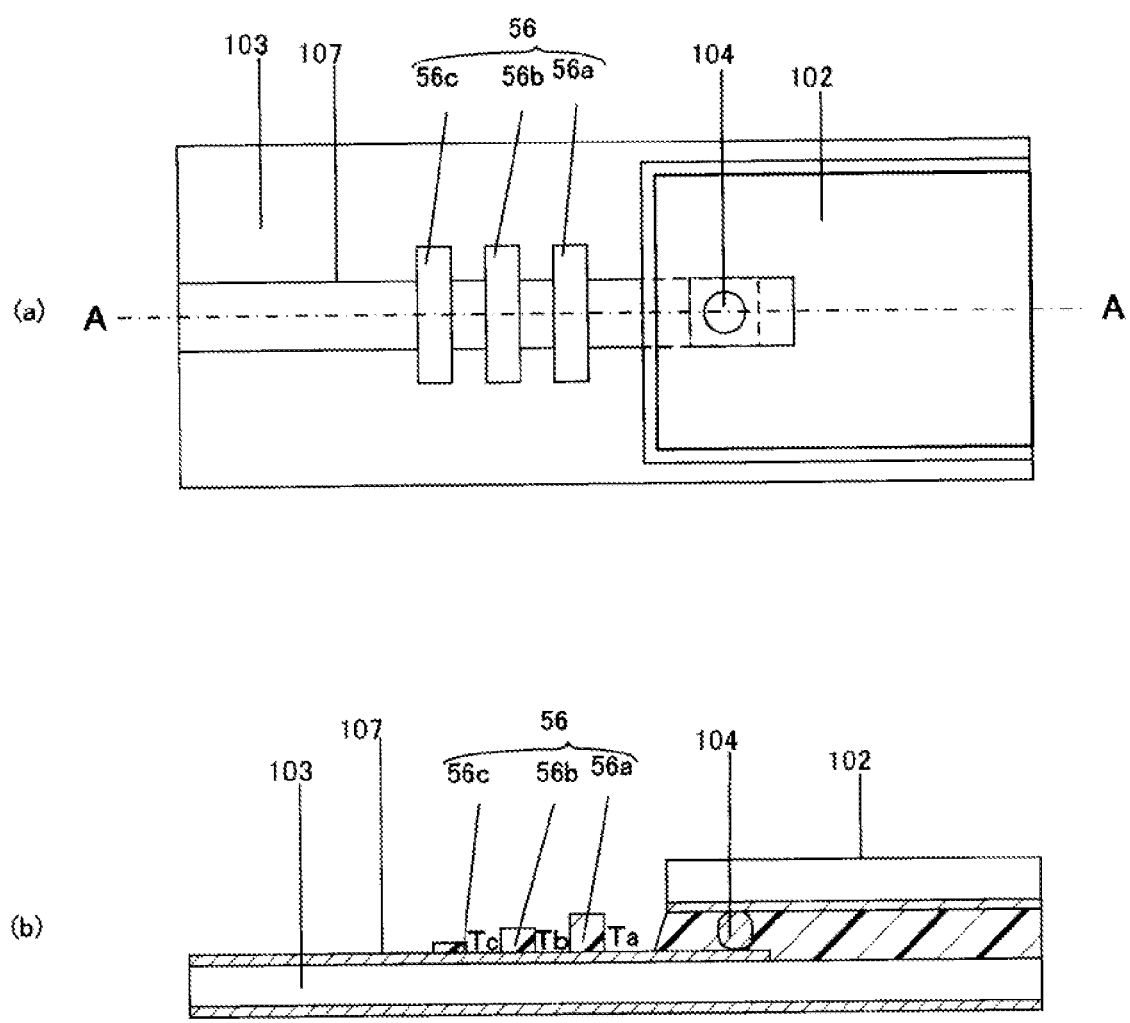
FIG. 28(a) and FIG. 28(b) are views showing a configuration of a high frequency module according to Embodiment 17 of the disclosure.

As another example than the examples in each of which the area, width or interval of each pattern on a wiring is changed, the height of each dielectric pattern forming an impedance adjustor circuit may be changed as shown in FIG. 28(a FIG. 28(b), FIG. 29(a) and FIG. 29(b).

In addition, in order to obtain an impedance adjustor circuit, for example, using a dielectric material such as a solder resist or silk, the impedance adjustor circuit can be formed easily by changing a mask for forming the pattern in the manufacturing process of the wiring board in accordance with the dielectric material. Alternatively, for example, a resin film or dielectric paste may be applied as a desired dielectric substance after the wiring board is manufactured.

Specifically, as a method for obtaining an impedance adjustor circuit, silk serving as a dielectric material may be printed on a solder resist or a module board using a silk screen in the same process as the process for forming characters to be printed. Alternatively, a desired dielectric substance may be applied by a dispenser after the board is manufactured.

Incidentally, an example of the position of the impedance adjustor circuit can be expressed by a signal wavelength $\lambda g = 1/(f \cdot \sqrt{\in r})$ on the wiring board 103, where $f$ designates the signal frequency for transmission in the wiring on the module board, that is, the wiring board 103, and $\in r$ designates the effective dielectric constant of the wiring board 103. The impedance adjustor circuit is placed more closely to the electrode on the high frequency circuit chip than a position at a distance of about $\lambda g/4$ therefrom. As shown in FIGS. 23 to 26, it is desirable that dimensions in the case where a plurality of dielectric patterns are arrayed are formed so that, for example, the width and interval of the dielectric material are set at $\lambda g/16$ respectively. This case is also based on the same reason as in the Embodiment 11. The number of pairs of "dielectric pattern presence" and "dielectric pattern absence" is only one in the case of $\lambda g/8$ when the distance is $\lambda g/4$. Therefore, the width and interval of the dielectric material are set at $\lambda g/16$ here in order to repeat "dielectric pattern presence" and "dielectric pattern absence" a plurality of times (twice).

As described previously, as a method for changing the height of the impedance adjustor circuit, for example, a solder resist may be applied a plurality of times or may be applied a plurality of times by a dispenser. Alternatively, materials with different viscosities may be applied, or the high frequency circuit chip may be entirely covered with a sealing resin.

In addition, when the impedance adjustor circuit is disposed on the front surface of the board, the shape of the impedance adjustor circuit may be trimmed, for example, by a laser beam machine. The characteristics may be adjusted after manufacturing.

Embodiment 19

Next, description will be made about a high frequency module according to Embodiment 19 of the disclosure.

In Embodiments 11 to 18 described above, examples in each of which an impedance adjustor circuit is formed integrally on the wiring board have been described. In the embodiment, a structure in which an impedance adjustor circuit (relaxation chip) 60 is mounted as a component will be described.

Figure 30:
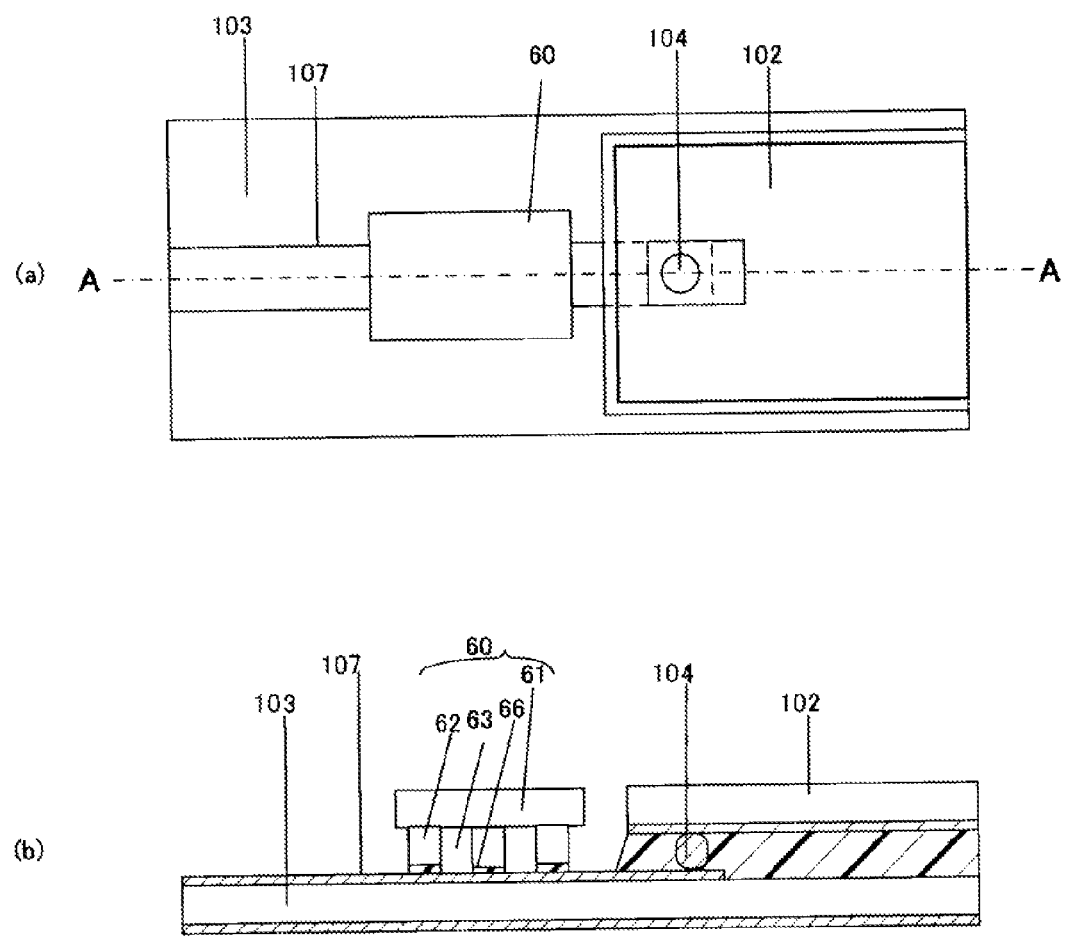
FIG. 30(a) and FIG. 30(b) are views showing a configuration of a high frequency module according to Embodiment 19 of the disclosure, FIG. 30(a) being a top view, FIG. 30(b) being a sectional view taken on the line A-A in FIG. 30(a).

FIG. 30(a) and FIG. 30(b) are views showing a configuration of a high frequency module according to Embodiment 19. FIG. 30(a) and FIG. 30(b) show a main portion top view and a main portion sectional view in the same manner as in Embodiments 11 to 18. The high frequency module according to the embodiment has a configuration including a high frequency circuit chip 102, a wiring board 103 and an impedance adjustor circuit 60. Constituent members the same as those in the high frequency module 101 according to Embodiment 11 are referred to by the same numerals correspondingly, and description thereof will be omitted.

The impedance adjustor circuit 60 has a configuration including a silicon impedance adjustor element chip 61 having convex portions 62 and concave portions 63. The impedance adjustor circuit 60 is flip-chip mounted in the same manner as the high frequency circuit chip 102. When a dielectric substance using a solder resist is charged between each convex portion 62 of the impedance adjustor element chip 61 and the wiring section 107 on the wiring board 103, the solder resist enters into gaps due to a capillary phenomenon to form a pattern of a dielectric layer 66.

Incidentally, the convex portions 62 of the impedance adjustor circuit 60 must be in tight contact onto the wiring section 107 on the wiring board 103. It is therefore desirable that each convex portion 62 is set to be substantially as high as a bump formed as the input/output terminal 104.

Figure 31:
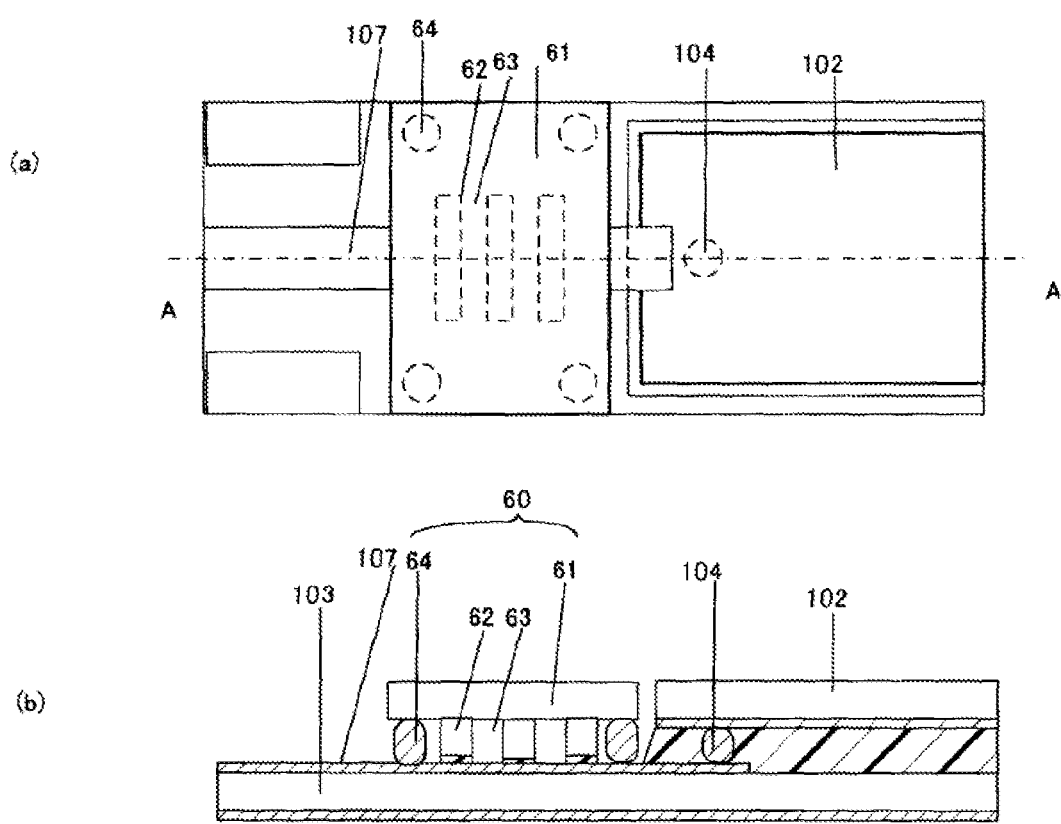
FIG. 31(a) and FIG. 31(b) are views showing a configuration of a modification of the high frequency module according to Embodiment 19 of the disclosure, FIG. 31(a) being a top view, FIG. 31(b) being a sectional view taken on the line A-A in FIG. 31(a).

In addition, as shown in FIG. 31(a) and FIG. 31(b) which are a main portion top view and a main portion sectional view of a modification, for example, bumps 64 disposed in four corners may be used for fixing the height of the impedance adjustor element chip 61. Thus, the position in the height direction can be decided in advance, so that the adhesion of the impedance adjustor circuit 60 onto the wiring board 103 can be enhanced.

Embodiment 20

Next, description will be made about a high frequency module according to Embodiment 20 of the disclosure.

Figure 32:
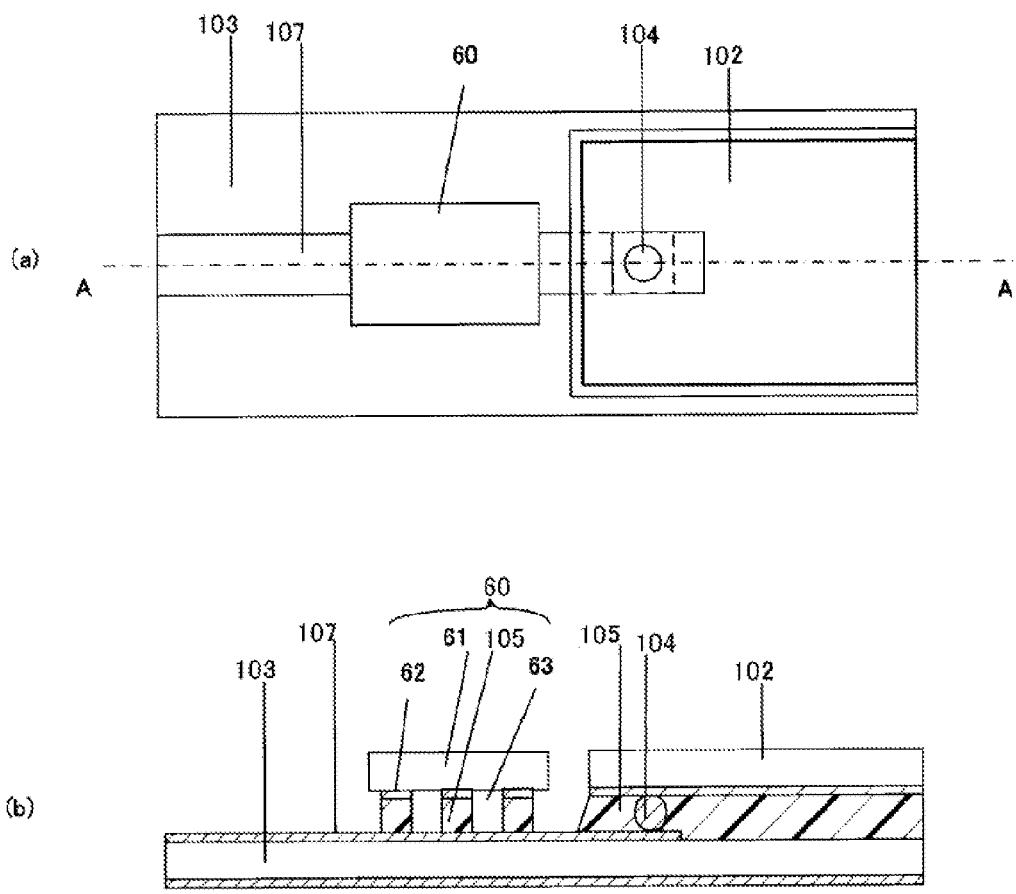
FIG. 32(a) and FIG. 32(b) are views showing a configuration of a modification of a high frequency module according to Embodiment 20 of the disclosure, FIG. 32(a) being a top view, FIG. 32(b) being a sectional view taken on the line A-A in FIG. 32(a).

In addition, a configuration as shown in FIG. 32(a) and FIG. 32(b) may be used. That is, a sealing resin 105 may be charged between each convex portion 62 of the impedance adjustor element chip 61 and the wiring section 107 on the wiring board 103 so as to enhance the adhesion to thereby relax the impedance. FIG. 32(a) and FIG. 32(b) are views showing a main portion of the high frequency module according to Embodiment 20 of the disclosure. FIG. 32(a) is a top view, and FIG. 32(b) is a sectional view taken on the line A-A in FIG. 32(a).

Incidentally, constituent members the same as those in the high frequency module 101 according to Embodiment 11 are referred to by the same numerals correspondingly, and description thereof will be omitted.

Also in the embodiment, the impedance adjustor circuit 60 has a configuration including a silicon impedance adjustor element chip 61 having convex portions 62 and concave portions 63 which are slightly smaller in height and depth than those in the Embodiment 19. The impedance adjustor circuit 60 is flip-chip mounted in the same manner as the high frequency circuit chip 102. A dielectric layer using the same resin as the sealing resin 105 is charged between each convex portion 62 of the impedance adjustor element chip 61 and the wiring section 107 on the wiring board 103.

The convex portions 62 of the impedance adjustor circuit 60 must be in tight contact onto the wiring section 107 on the wiring board 103.

As described above, as an example of the mounting procedure, the high frequency circuit chip 102 and a chip including the impedance adjustor circuit 60 are bump-mounted in a mounting process after the module board is manufactured. After that, in order to enhance the mounting strength of each chip, the sealing resin 105 is injected between the chip and the board, and heated to a predetermined temperature and for a predetermined time in a furnace. Thus, the sealing resin 105 is hardened.

Embodiment 21

Next, description will be made about a high frequency module according to Embodiment 21 of the disclosure.

Incidentally, the sealing resin 105 is attached to each convex portion 62 of the impedance adjustor element chip 61 in the Embodiment 20. In the embodiment, however, the sealing resin 105 charged between the high frequency circuit chip 102 and the wiring board 103 is charged entirely between the impedance adjustor element chip 61 and the wiring section 107 of the wiring board 103.

In the embodiment, convex portions 62S are patterned and concave portions 63S are formed so that the width of the sealing resin 105 decreases as it goes outward from an external connection terminal of the high frequency circuit chip 102. In addition, as shown in FIG. 33(a) and FIG. 33(b), the sealing resin 105 may be charged between each convex portion 62S of the impedance adjustor element chip 61 and the wiring section 107 on the wiring board 103 so as to enhance the adhesion to thereby relax the impedance.

Figure 33:
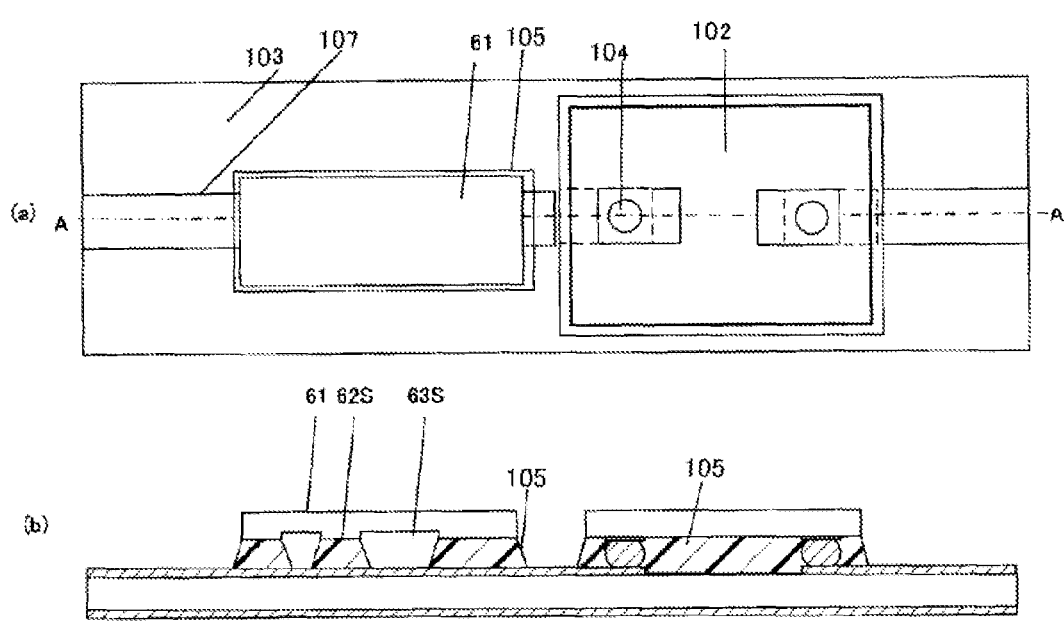
FIG. 33(a) and FIG. 33(b) are views showing a configuration of a modification of a high frequency module according to Embodiment 21 of the disclosure, FIG. 33(a) being a top view, FIG. 33(b) being a sectional view taken on the line A-A in FIG. 33(a).

FIG. 33(a) and FIG. 33(b) are views showing a configuration of the high frequency module according to Embodiment 21 of the disclosure. FIG. 33(a) is a top view, and FIG. 33(b) is a sectional view taken on the line A-A in FIG. 33(a).

Incidentally, constituent members the same as those in the high frequency module 101 according to Embodiment 11 are referred to by the same numerals correspondingly, and description thereof will be omitted.

According to the embodiment, in the impedance adjustor circuit 60, a dielectric layer pattern is formed out of a pattern of convex portions and concave portions. Thus, the pattern can be adjusted easily. In addition, the impedance adjustor element chip as a whole is fixedly attached by a sealing resin. Therefore, the adhesion is excellent. In addition, the impedance adjustor element chip can be mounted at the same time as the high frequency circuit chip. Thus, the mounting work efficiency is excellent.

Incidentally, it is important that the convex portions 62 of the impedance adjustor circuit 60 are in tight contact onto the wiring section 107 on the wiring board 103.

Incidentally, in the Embodiments 19 to 21, the impedance adjustor element chip is disposed near the high frequency circuit chip. However, in a modification of the high frequency module as shown in FIGS. 34(*a*) to 34(*d*), an impedance adjustor section 60R may be arranged electrically independently of an internal circuit of the high frequency circuit chip 102 and formed integrally in a part of a circumferential edge portion of the high frequency circuit chip.

Figure 34:
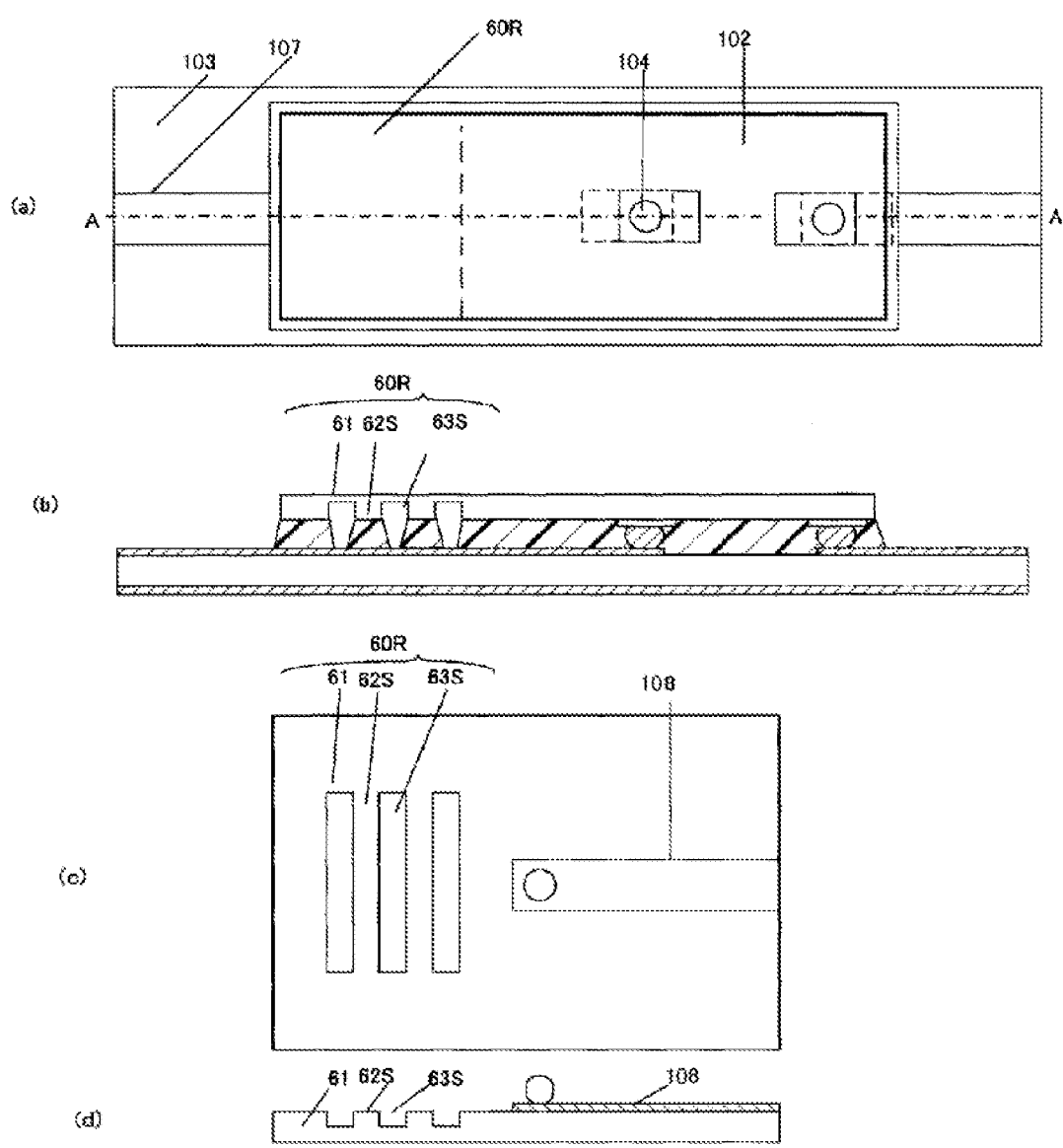
FIG. 34(a) to FIG. 34(d) are views showing a configuration of a modification of the high frequency module according to Embodiment 21 of the disclosure.

FIG. 34(*a*) and FIG. 34(*b*) are a main portion top view and a main portion sectional view showing the high frequency module according to the embodiment. FIG. 34(*c*) and FIG. 34(*d*) are a top view and a sectional view of the high frequency circuit chip according to the embodiment.

According to the configuration, the number of mounting steps is reduced so that the manufacturing cost can be suppressed. In the impedance adjustor section 60R, a dielectric layer pattern is formed based on a pattern of the concave portions 60*c* and as a reverse pattern thereof. Thus, the pattern can be adjusted easily. In addition, the impedance adjustor element chip 61 as a whole is fixedly attached by a sealing resin. Therefore, the adhesion is excellent. In addition, the impedance adjustor element chip can be mounted at the same time as the high frequency circuit chip. Thus, the mounting work efficiency is excellent.

Incidentally, it is important that the convex portions 62S of the impedance adjustor section 60R are in tight contact onto the wiring section 107 on the wiring board 103.

Embodiment 22

Next, description will be made about a high frequency module according to Embodiment 22 of the disclosure.

Figure 35:
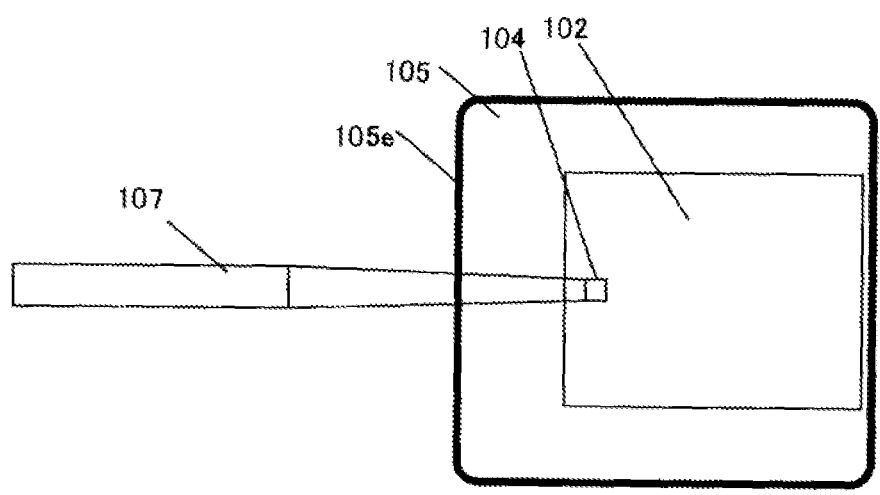
FIG. 35 is a view showing a main portion top view showing a high frequency module according to Embodiment 22 of the disclosure.

In Embodiments 11 to 18, description has been made above about examples in each of which an impedance adjustor circuit is formed integrally on the wiring board. In Embodiments 19 to 21, description has been made above about structures in each of which an impedance adjustor element (relaxation chip) as an impedance adjustor circuit is mounted as a component. In the embodiment, however, description will be made about an example in which an impedance adjustor circuit is obtained using the shape of a wiring on the wiring board 103 as shown in FIG. 35 which is a main portion top view of the high frequency module according to the embodiment.

In the embodiment, a pattern of the wiring section 107 itself on the wiring board 103 is narrowed in width gradually as it goes outward, so that the gradually narrowed pattern of the wiring section 107 serves as an impedance adjustor section.

Incidentally, constituent members the same as those in the high frequency module 101 according to Embodiment 11 are referred to by the same numerals correspondingly, and description thereof will be omitted.

The impedance adjustor section in the embodiment is configured to increase in width gradually from the position of a bump as the input/output terminal 104 of the high frequency circuit chip 102, and reach the same width as a wiring in a position beyond an end portion (sealing end 105*e*) of the sealing resin 105 and at a predetermined distance L0 from the position of the input/output terminal 104. The length L0 of the portion where the width is reduced gradually is about $\lambda g/4$ with respect to the wavelength of a signal frequency.

The portion where the impedance is discontinuous is relaxed, and VSWR approaches 1.

Figure 40:
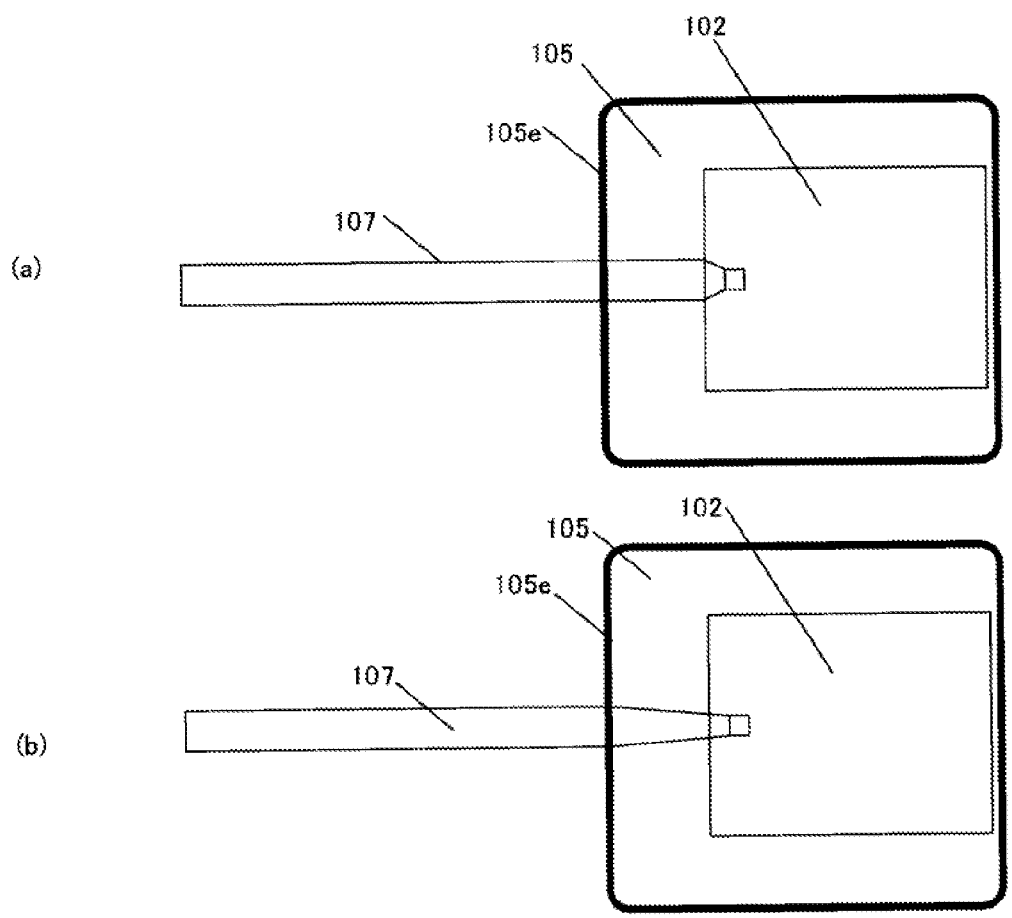
FIG. 40(a) and FIG. 40(b) are views showing main portion top views of high frequency modules according to a comparative example.
Figure 41:
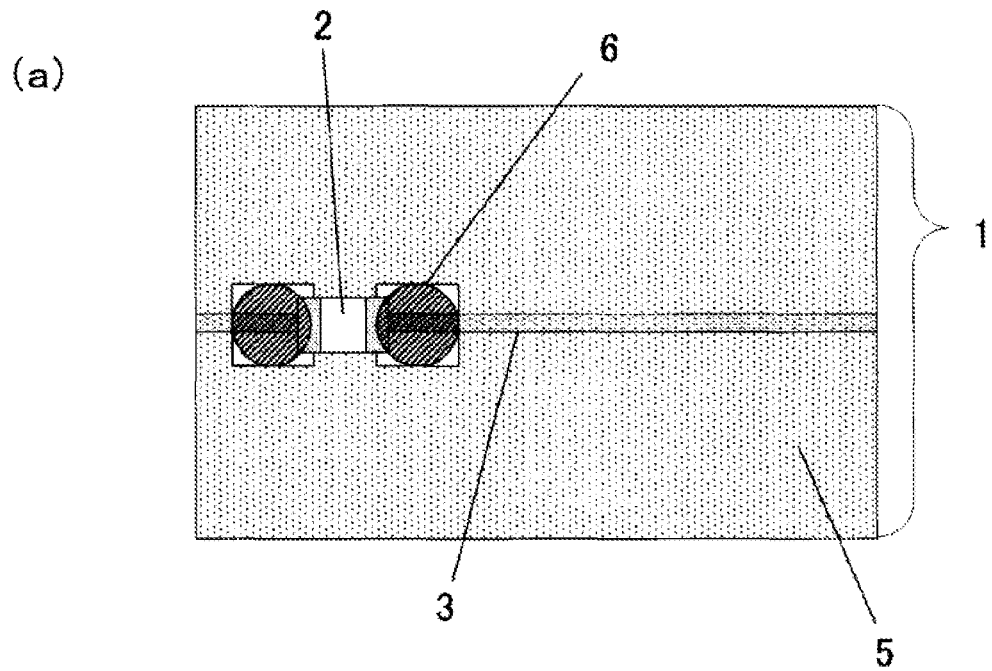
FIG. 41(a) is an explanatory view (top view) showing a main portion configuration of a high frequency module using a high frequency module wiring board according to a background-art example.
FIG. 41(b) is an explanatory view (sectional view) cut in a wiring direction.
Figure 41:
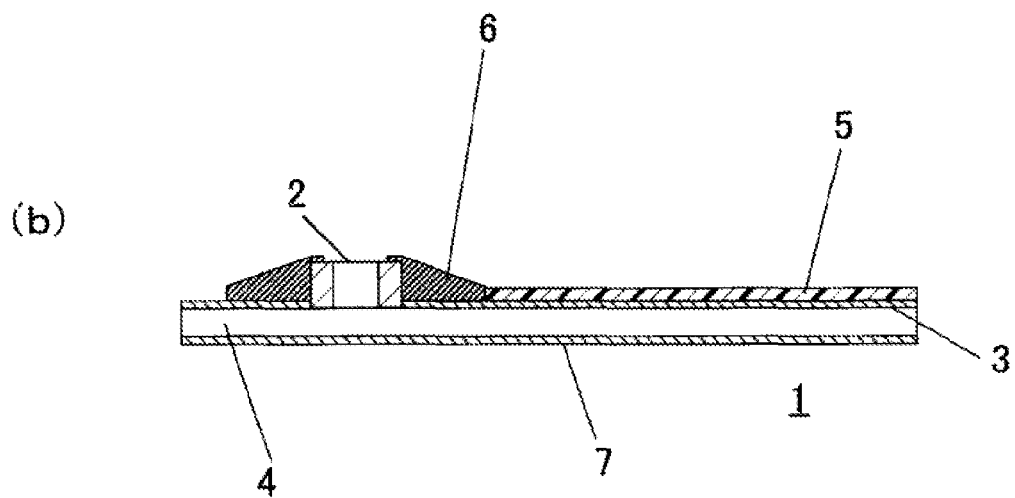

Incidentally, a usual wiring pattern is narrowed gradually under a high frequency circuit chip as shown in FIG. 40(*a*) or narrowed gradually in a region up to the sealing end 105*e* as shown in FIG. 40(*b*).

Embodiment 23

Next, description will be made about a high frequency module according to Embodiment 23 of the disclosure.

Figure 36:
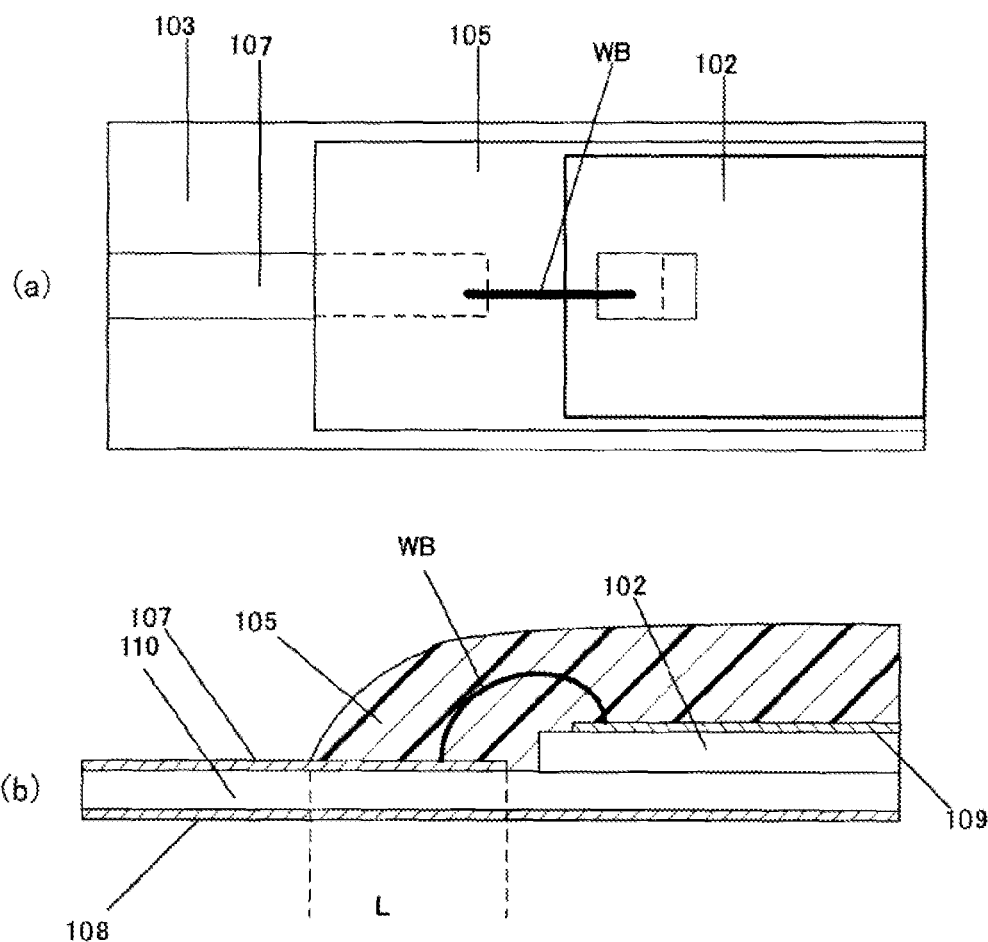
FIG. 36(a) and FIG. 36(b) are a main portion top view and a sectional view of a high frequency module according to Embodiment 23 of the disclosure.

In Embodiments 11 to 22, description has been made above about examples in each of which the high frequency circuit chip 102 is mounted on the wiring board 103 by flip-chip mounting. In the embodiment, description will be made about a case in which the high frequency circuit chip 102 is mounted by face-up connection. FIG. 36(*a*) and FIG. 36(*b*) are a main portion top view and a main portion sectional view of the high frequency module according to Embodiment 23 of the disclosure.

When the high frequency circuit chip 102 is mounted on the wiring board 103 by face-up connection, the high frequency circuit chip 102 is connected to the wiring section 107 through a wire WB, and the wire WB and the high frequency circuit chip 102 are covered with the sealing resin 105.

In the embodiment, the length L of the impedance adjustor circuit is determined based on the position where the high frequency circuit chip 102 is covered with the sealing resin 105 when the high frequency circuit chip 102 is mounted. The position where the high frequency circuit chip 102 is covered with the sealing resin 105 and the angle of a sealing end 105*e* of the sealing resin 105 on the wiring section 107 are roughly adjusted. Thus, in the face-up mounting, the length of the impedance adjustor circuit differs from one high frequency circuit chip to another even if the same high frequency circuit chips are used.

Constituent members the same as those in the high frequency module 101 according to Embodiment 11 are also referred to by the same numerals correspondingly in the embodiment, and description thereof will be omitted.

In addition, in the embodiment, even after the shape of the end portion of the sealing resin 105 is adjusted to a design value and formed, the sealing resin 105 may be cut out partially while impedance matching is secured. Thus, the impedance matching can be further enhanced.

In addition, a wall portion may be formed out of a high-viscosity resin so as to adjust the taper of the sealing end 105*e*. In addition, the degree of dripping may be controlled using a temperature profile in the process of hardening the sealing resin, so that the taper of the sealing end 105*e* can be adjusted.

In addition, although the impedance adjustor circuit is made of a dielectric layer in the embodiment, the invention is not limited to the dielectric layer. For example, the position where an SMT component is mounted may be set within a range of $\lambda g/4$, or the length of conductive paste for connecting the SMT component may be adjusted. Alternatively, it is possible to perform such an adjustment that the dielectric layer may be cut by laser machining so as to adjust the shape and thickness thereof.

The embodiments include the following disclosures of forms.

<Disclosure 1 of High Frequency Module>

A high frequency module, comprising:

a high frequency circuit chip;

a wiring board provided with a wiring section for connecting an input/output terminal of the high frequency circuit chip; and a sealing resin charged to cover at least a connection section between the high frequency circuit chip and the wiring section, wherein the wiring section includes an impedance adjustor circuit outside the input/output terminal.

<Disclosure 2 of High Frequency Module>

A high frequency module, comprising:

a high frequency circuit chip;

a wiring board provided with a wiring section for flip-chip connecting an input/output terminal of the high frequency circuit chip; and a sealing resin charged between the wiring board and the high frequency circuit chip, wherein the wiring section includes an impedance adjustor circuit outside the input/output terminal.

<Disclosure 3 of High Frequency Module>

A high frequency module according to the Disclosure 1 or 2 of the high frequency module, wherein the impedance adjustor circuit is a dielectric layer with a predetermined width formed on the wiring section in a position outside the input/output terminal and at a predetermined distance therefrom.

<Disclosure 4 of High Frequency Module>

A high frequency module according to the Disclosure 3 of high frequency module, wherein:

the dielectric layer includes a plurality of dielectric patterns formed along the wiring section.

<Disclosure 5 of High Frequency Module>

A high frequency module according to the Disclosure 4 of high frequency module, wherein:

the intervals of the dielectric patterns increase as they go outward from the high frequency circuit chip.

<Disclosure 6 of High Frequency Module>

A high frequency module according to the Disclosure 4 of high frequency module, wherein the pattern areas of the dielectric patterns decrease as they go outward from the high frequency circuit chip.

<Disclosure 7 of High Frequency Module>

A high frequency module according to the Disclosure 4 of high frequency module, wherein the film thicknesses of the dielectric patterns decrease as they go outward from the high frequency circuit chip.

<Disclosure 8 of High Frequency Module>

A high frequency module according to the Disclosure 3 of high frequency module, wherein the width of a region where the dielectric layer and the wiring section overlap with each other decreases gradually as the region is away outwardly from the high frequency circuit chip.

<Disclosure 9 of High Frequency Module>

A high frequency module according to any one of the Disclosures 3 to 8 of high frequency module, wherein the dielectric layer is formed to selectively cover a circumferential edge portion of a wiring forming the wiring section.

<Disclosure 10 of High Frequency Module>

A high frequency module according to any one of the Disclosures 3 to 9 of high frequency module, wherein the dielectric layer is formed out of the same material as the sealing resin.

<Disclosure 11 of High Frequency Module>

A high frequency module according to the Disclosure 2 or 3 of high frequency module, wherein the impedance adjustor circuit includes:

an impedance adjustor element chip which is mounted on the wiring section and outside the input/output terminal, and which has convex portions and concave portions in a surface opposed to the wiring board; and a dielectric layer which is charged into an interface between each convex portion of the impedance adjustor element chip and the wiring section.

<Disclosure 12 of High Frequency Module>

A high frequency module according to the Disclosure 11 of high frequency module, wherein the impedance adjustor element chip is formed integrally with the high frequency circuit chip.

<Disclosure 13 of High Frequency Module>

A high frequency module according to the Disclosure 11 of high frequency module, wherein the convex portions are substantially as high as a bump formed as the input/output terminal.

<Disclosure 14 of High Frequency Module>

A high frequency module according to the Disclosure 1 or 2 of high frequency module, wherein the impedance adjustor circuit forms a tapered portion in the wiring section on the wiring board, the line width of the tapered portion increasing gradually outward from the input/output terminal of the high frequency circuit chip up to a position of about $\lambda g/4$ with respect to a wavelength $\lambda g$ of a signal frequency.

<Disclosure 15 of High Frequency Module>

A high frequency module according to the Disclosure 1 or 2 of high frequency module, wherein the high frequency circuit chip is a microwave or millimeter-wave circuit chip.

<Disclosure 1 of High Frequency Module Board>

A high frequency module wiring board, comprising:

a substrate;

a high frequency transmission line using a wiring section formed on the substrate;

an impedance adjustor circuit connected to the high frequency transmission line; and a high frequency circuit chip mounted on a terminal section of the high frequency transmission line, wherein the impedance adjustor circuit forms a tapered portion in the wiring section on the wiring board, the line width of the tapered portion increasing gradually outward from an input/output terminal of the high frequency circuit chip up to a position of about $\lambda g/4$ with respect to a wavelength $\lambda g$ of a signal frequency.

<Disclosure 2 of High Frequency Module Board>

A high frequency module board according to the disclosure 1 of high frequency module board, wherein the high frequency circuit chip is a microwave or millimeter-wave circuit chip.

According to the disclosures of high frequency module and high frequency module board, the impedance adjustor circuit is provided on the wiring board. Accordingly, discontinuity caused by a change in impedance can be reduced. As a result, in flip-flop connection, discontinuity caused by a change in impedance of a wiring on the wiring board can be reduced even when the circuit surface of the high frequency circuit chip is entirely covered with a sealing resin.

The disclosure has been described in detail and with reference to specific embodiments. However, it is apparent from those skilled in the art that various changes or modifications can be added without departing from the spirit and scope of the invention.

The present application is based on a Japanese patent application (Patent Application No. 2011-181946) filed on Aug. 23, 2011 and a Japanese patent application (Patent Application No. 2011-186338) filed on Aug. 29, 2011, the contents of which are incorporated herein by reference.

INDUSTRIAL APPLICABILITY

As described above, according to a high frequency module wiring board according to the disclosure, a solder resist layer covering a wiring section has a configuration including openings at portions on the wiring section. It is therefore possible to provide a high frequency module wiring board, in which high frequency characteristics can be kept and the wiring strength is high. The wiring board can be effectively applied to a main circuit configuration.

In addition, according to the disclosure, impedance mismatching in the high frequency module can be reduced. It is therefore possible to provide a high frequency module (e.g. a wireless module) with small transmission loss. The high frequency module is useful as a wireless communication terminal.

REFERENCE SIGNS LIST 1 wiring board
2 surface mount type chip component (SMT component)
2a,2b input/output terminal
3,3s,3p wiring section
4 dielectric layer
5 solder resist layer
solder
7 back wiring section
8,8c,8d,8p opening
8s side opening
9 high frequency IC chip
9a,9b,9c input/output terminal
10 antenna element
101 high frequency module
102 high frequency circuit chip
103 wiring board
104 input/output terminal (bump)
105 sealing resin
105e sealing end
106 impedance adjustor circuit
107 wiring section
107e edge
108 ground layer
109 chip wiring
110 dielectric substrate
16,26,36,46,56,166 impedance adjustor circuit
16a,16b,16c dielectric layer pattern
60R impedance adjustor section
61 impedance adjustor element chip
62 convex portion
63 concave portion

The invention claimed is:

1. A high frequency module wiring board, comprising:
a wiring section for high frequency transmission, the wiring section being arranged on the wiring board; and
a solder resist layer that is formed on and contacts the wiring section;
wherein the solder resist layer has an opening section at a part of the wiring section in a region extending within a predetermined distance from an input/output terminal of a surface mount type chip component mounted on the wiring board and the opening section of the solder resist layer is composed of a stripe-like pattern of solder resist so as to cover the wiring section at predetermined intervals.

2. The high frequency module wiring board according to claim 1, wherein the opening section includes side surfaces of the wiring section.

3. The high frequency module wiring board according to claim 1, wherein the opening section includes a plurality of openings and a width of the openings increases as a distance between a respective opening and the input/output terminal of the surface mount type chip component mounted on the wiring section increases.

4. A high frequency module wherein a high frequency module wiring board according to claim 1 is used; and
wherein the surface mount type chip component is connected to the wiring section through the input/output terminal.

5. A high frequency module wherein a high frequency module wiring board according to claim 1 is used; and
wherein the wiring section is used for microwave or millimeter-wave transmission.

6. The high frequency module wiring board according to claim 1, wherein the opening section includes a plurality of openings formed at predetermined intervals in the solder resist layer.

7. The high frequency module wiring board according to claim 6, wherein the opening section is formed along the wiring section excluding edge portions of the wiring section.

8. The high frequency module wiring board according to claim 6, wherein the intervals in the opening section are not longer than λg/8 of a transmission frequency on the wiring section.

9. The high frequency module wiring board according to claim 6, wherein the interval between adjacent openings of the plurality of openings decreases as a distance between the openings and the input/output terminal of the surface mount type chip component mounted on the wiring section increases.

* * * * *